US012588450B2

(12) United States Patent
Kamimura

(10) Patent No.: US 12,588,450 B2
(45) Date of Patent: Mar. 24, 2026

(54) POST-CMP CLEANING LIQUID COMPRISING A SUBSTITUTED BENZENE ANTICORROSIVE AGENT, CHELANT, AND AMINE COMPOUND

(71) Applicant: FUJIFILM Corporation, Tokyo (JP)

(72) Inventor: Tetsuya Kamimura, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 284 days.

(21) Appl. No.: 17/849,126

(22) Filed: Jun. 24, 2022

(65) Prior Publication Data

US 2022/0336209 A1 Oct. 20, 2022

Related U.S. Application Data

(63) Continuation of application No. PCT/JP2020/043428, filed on Nov. 20, 2020.

(30) Foreign Application Priority Data

Dec. 26, 2019 (JP) ................................ 2019-235996

(51) Int. Cl.

| | |
|---|---|
| ***H01L 21/02*** | (2006.01) |
| ***B08B 3/04*** | (2006.01) |
| ***C11D 3/00*** | (2006.01) |
| ***C11D 3/20*** | (2006.01) |
| ***C11D 3/28*** | (2006.01) |
| ***C11D 3/30*** | (2006.01) |
| ***C11D 3/39*** | (2006.01) |
| ***C11D 7/26*** | (2006.01) |

(52) U.S. Cl.

CPC .......... *H01L 21/02057* (2013.01); *B08B 3/04* (2013.01); *C11D 3/0042* (2013.01); *C11D 3/0073* (2013.01); *C11D 3/2003* (2013.01); *C11D 3/28* (2013.01); *C11D 3/30* (2013.01); *C11D 3/3927* (2013.01); *C11D 7/265* (2013.01)

(58) Field of Classification Search

CPC . C11D 2111/12; C11D 3/0073; C11D 3/0047; C11D 3/30; C11D 3/33; C11D 3/43; C11D 7/3218; C11D 7/5004; C11D 7/5013; C11D 2111/44

See application file for complete search history.

(56) References Cited

U.S. PATENT DOCUMENTS

2008/0076688 A1* 3/2008 Barnes .................... C11D 3/30 134/42
2009/0239777 A1 9/2009 Angst et al.
2010/0261632 A1* 10/2010 Korzenski ............ C11D 3/2075 510/175
2012/0283163 A1 11/2012 Barnes et al.
2014/0264151 A1 9/2014 Ko
2016/0010035 A1 1/2016 Liu et al.
2016/0201016 A1* 7/2016 Ivanov .................... C11D 7/06 510/175
2016/0340620 A1* 11/2016 Sun ........................ C11D 3/30
2018/0291309 A1* 10/2018 Frye ...................... C11D 3/361
2019/0048292 A1* 2/2019 Wu ...................... C11D 7/3281
2019/0168265 A1* 6/2019 White ...................... B08B 3/04
2019/0177669 A1 6/2019 Kamimura et al.
2019/0177671 A1* 6/2019 Parson .................. C11D 1/008
2020/0071642 A1* 3/2020 Thomas ............... C11D 3/3765
2020/0115661 A1* 4/2020 Grandstrom ............. C11D 1/06
2020/0181535 A1* 6/2020 Das .................. H01L 21/02065
2020/0199500 A1* 6/2020 White .................... C09K 13/00
2020/0231900 A1* 7/2020 Harada .................. C11D 1/345

FOREIGN PATENT DOCUMENTS

JP 2010-527405 A 8/2010
JP 2012-506457 A 3/2012
JP 2015-165561 A 9/2015
JP 2016-021573 A 2/2016
JP 2016-519423 A 6/2016
WO 2018/043440 A1 3/2018
WO 2018/191424 A1 10/2018

OTHER PUBLICATIONS

International Search Report dated Feb. 16, 2021, issued in International Application No. PCT/JP2020/043428.
Written Opinion dated Feb. 16, 2021, issued in International Application No. PCT/JP2020/043428.
International Preliminary Report on Patentability dated Jun. 28, 2022, issued in International Application No. PCT/JP2020/043428.

* cited by examiner

*Primary Examiner* — Charles I Boyer
(74) *Attorney, Agent, or Firm* — Sughrue Mion, PLLC

(57) ABSTRACT

An object of the invention is to provide a method of cleaning semiconductor substrates that is excellent in abrasive particle removing performance with respect to semiconductor substrates having undergone CMP, as well as a cleaning liquid for semiconductor substrates having undergone CMP. The invention provides a method of cleaning semiconductor substrates, the method comprising a cleaning step of cleaning, by use of a cleaning liquid, a semiconductor substrate having undergone CMP using a polishing liquid containing abrasive particles. The semiconductor substrate contains metal, and the cleaning liquid has a pH of more than 7 at 25° C. The cleaning liquid comprises: a chelating agent; a specific component A; and an anticorrosive. The method satisfies Condition 1 that a product of a contact angle ratio obtained by a specific test method 1 and a specific degree of agglomeration obtained by a specific test method 2 is not more than 15.

39 Claims, No Drawings

POST-CMP CLEANING LIQUID COMPRISING A SUBSTITUTED BENZENE ANTICORROSIVE AGENT, CHELANT, AND AMINE COMPOUND

CROSS-REFERENCE TO RELATED APPLICATIONS

This application is a Continuation of PCT International Application No. PCT/JP2020/043428 filed on Nov. 20, 2020, which claims priority under 35 U.S.C. § 119(a) to Japanese Patent Application No. 2019-235996 filed on Dec. 26, 2019. The above application is hereby expressly incorporated by reference, in its entirety, into the present application.

BACKGROUND OF THE INVENTION

The present invention relates to a cleaning method and a cleaning liquid for semiconductor substrates.

Semiconductor devices such as charge-coupled devices (CCDs) and memories are manufactured by forming fine electronic circuit patterns on substrates using the photolithography technology. Specifically, a semiconductor device is manufactured by forming a resist film on a laminate including a metal film which is a wiring material, an etching stop layer, and an interlayer dielectric layer on a substrate and carrying out a photolithography step and a dry etching step (e.g., plasma etching).

In some cases, a dry etching residue (for instance, metal components such as titanium-based metal derived from a metallic hard mask, or organic components derived from a photoresist film) remains on a substrate having undergone the dry etching step.

In manufacture of semiconductor devices, a chemical mechanical polishing (CMP) process is sometimes carried out to planarize a surface of a substrate having a metal wiring film, a barrier metal, an insulating film and the like by use of a polishing slurry containing fine abrasive particles (e.g., silica, alumina). In the CMP process, metal components derived from the fine abrasive particles used in the CMP process and from the metal wiring film, the barrier metal and the like having been polished tend to remain on the surface of the semiconductor substrate after polishing.

Since those residues may cause a short-circuit between wires and affect electrical properties of a semiconductor, a cleaning step for removing the residues from the surface of the semiconductor substrate is usually carried out.

For instance, JP 2016-021573 A describes a method of cleaning a semiconductor wafer comprising: a) providing a semiconductor wafer having at least a surface containing at least one metal and residues; and b) contacting at least a portion of the surface having the residues with a metal corrosion inhibition composition containing at least one specific multi-functional acid, at least one specific multi-functional amine, and a liquid carrier selected from the group consisting of an organic solvent, water, and the combination thereof.

SUMMARY OF THE INVENTION

The present inventor studied methods of cleaning semiconductor substrates having undergone CMP by reference to JP 2016-021573 A and the like and as a result found that such semiconductor substrate cleaning methods have room for further improvement in performance of removing abrasive particles remaining on surfaces of metal films (e.g., a Cu-containing metal film, a W-containing metal film, and a Co-containing metal film) that serve as a wiring material or a plug material.

An object of the present invention is to provide a method of cleaning semiconductor substrates that is excellent in abrasive particle removing performance with respect to semiconductor substrates having undergone CMP. Another object of the present invention is to provide a cleaning liquid for semiconductor substrates having undergone CMP.

The present inventor found that the above objects can be attained with the following configuration.

[1] A method of cleaning semiconductor substrates, the method comprising a cleaning step of cleaning, by use of a cleaning liquid, a semiconductor substrate having undergone a chemical mechanical polishing process using a polishing liquid containing abrasive particles, wherein the semiconductor substrate contains metal, the cleaning liquid has a pH of more than 7 at 25° C., the cleaning liquid comprises:
 - a chelating agent;
 - a component A that is at least one selected from the group consisting of a primary amine, a secondary amine, and a tertiary amine, a first acidity constant of a conjugated acid of the component A being not less than 8.0; and
 - an anticorrosive, and the method satisfies Condition 1 that a product of a contact angle ratio obtained by a test method 1 described below and a specific degree of agglomeration obtained by a test method 2 described below is not more than 15.

[2] The method according to [1], wherein the second contact angle measured by the test method 2 is not more than 30°.

[3] The method according to [1] or [2], wherein the average secondary particle size of the abrasive particles measured in the test method 2 is not more than 100 nm.

[4] The method according to any one of [1] to [3], wherein the specific degree of agglomeration obtained in the test method 2 is 1 to 10.

[5] The method according to any one of [1] to [4], wherein the cleaning liquid has a pH of 8.0 to 12.0.

[6] The method according to any one of [1] to [5], wherein the component A includes an amino alcohol.

[7] The method according to [6], wherein the amino alcohol has a primary amino group.

[8] The method according to [6] or [7], wherein a mass ratio of a content of the amino alcohol to a content of the anticorrosive is 1 to 100.

[9] The method according to any one of [1] to [8], wherein the anticorrosive includes at least one selected from the group consisting of a compound B represented by Formula (1) described below, and a nitrogen-containing heteroaromatic compound.

[10] The method according to [9], wherein the nitrogen-containing heteroaromatic compound includes a compound having a pyrazole ring or a compound having a pyrimidine ring.

[11] The method according to any one of [1] to [10], wherein the chelating agent includes at least one selected from the group consisting of a phosphonic acid-based chelating agent and an aminopolycarboxylic acid-based chelating agent.

[12] The method according to any one of [1] to [11], wherein a mass ratio of a content of the chelating agent to a content of the anticorrosive is 0.01 to 20.

[13] The method according to any one of [1] to [12], wherein the cleaning liquid further contains two or more reducing agents.

[14] The method according to any one of [1] to [13], wherein the cleaning liquid further contains a quaternary ammonium compound having an asymmetric structure.

[15] The method according to any one of [1] to [14], wherein a content of water in the cleaning liquid is 60 to 99 mass % based on a total mass of the cleaning liquid.

[16] A cleaning liquid for semiconductor substrates having undergone a chemical mechanical polishing process using a polishing liquid containing abrasive particles, wherein the cleaning liquid has a pH of more than 7 at 25° C., the cleaning liquid comprises:

a chelating agent;

a component A that is at least one selected from the group consisting of a primary amine, a secondary amine, and a tertiary amine, a first acidity constant of a conjugated acid of the component A being not less than 8.0;

an anticorrosive; and water, a content of the water is 60 to 99 mass % based on a total mass of the cleaning liquid, and the cleaning liquid satisfies Condition 1 that a product of a contact angle ratio obtained by a test method 1 described below and a specific degree of agglomeration obtained by a test method 2 described below is not more than 15.

[17] A cleaning liquid for semiconductor substrates having undergone a chemical mechanical polishing process using a polishing liquid containing abrasive particles, wherein the cleaning liquid has a pH of more than 7 at 25° C., the cleaning liquid comprises:

a chelating agent;

a component A that is at least one selected from the group consisting of a primary amine, a secondary amine, and a tertiary amine, a first acidity constant of a conjugated acid of the component A being not less than 8.0;

an anticorrosive; and water, a content of the water is 60 to 99 mass % based on a total mass of the cleaning liquid, and the cleaning liquid satisfies Condition 1 that a product of a contact angle ratio obtained by a test method 1 described below and a specific degree of agglomeration obtained by a test method 2 described below is not more than 15, The present invention makes it possible to provide a method of cleaning semiconductor substrates that is excellent in abrasive particle removing performance with respect to semiconductor substrates having undergone CMP. The present invention also makes it possible to provide a cleaning liquid for semiconductor substrates having undergone CMP.

DETAILED DESCRIPTION OF THE INVENTION

One exemplary embodiment of the invention is described below.

In this specification, a numerical range expressed in the form of "A to B" should read as a range including both the values A and B as the range's lower and upper limits, respectively.

In this specification, when a certain component comprising two or more types is present, the "content" of the certain component means the total content of the two or more types.

In this specification, "ppm" means "parts per million ($10^{-6}$)," and "ppb" means "parts per billion ($10^{-9}$)."

In compounds described in this specification, isomers (compounds with the same number of atoms but different structures), optical isomers, and isotopes may be included unless particularly limited. As isomers and isotopes, only one type or plural types may be included.

In this specification, a "C log P value" is a value obtained by calculating a common logarithm log P of a partition coefficient P between 1-octanol and water. For a method of calculating the C log P value and software used therefor, known ones can be used, and a C log P program incorporated in ChemBioDraw Ultra 12.0 manufactured by CambridgeSoft Corporation is used in the present invention unless otherwise specified.

In this specification, "psi" refers to "pound-force per square inch," and 1 psi=6894.76 Pa.

The cleaning method of the present invention includes a cleaning step of cleaning a semiconductor substrate having undergone a chemical mechanical polishing process. This semiconductor substrate contains metal. A cleaning liquid used in cleaning the semiconductor substrate has a pH of more than 7 at 25° C. and contains a chelating agent, a component A that is a specific amine compound, and an anticorrosive. The cleaning liquid of the invention is characterized in satisfying Condition 1 that a product of a contact angle ratio obtained by a specific test method 1 and a specific degree of agglomeration obtained by a specific test method 2 (hereinafter also called "parameter D.F") is not more than 500.

The present inventor found that in a method of cleaning semiconductor substrates having undergone a CMP process, when a cleaning liquid has a pH of more than 7 at 25° C. and contains a chelating agent, a specific component A, and an anticorrosive and also when the method satisfies Condition 1 above, it is possible to suppress adhesion of abrasive particles generated through the CMP process to a surface of a metal film of a semiconductor substrate, thus improving performance of removing abrasive particles remaining on the surface of the metal film.

While the precise mechanism is unclear why the effectiveness of the invention is obtained by use of the cleaning method as above, it was found that abrasive particles contained in a polishing liquid make contact with metal (e.g., copper, tungsten, and/or cobalt) generated through polishing of a metal film and consequently have a higher degree of agglomeration, and those agglomerated abrasive particles adhere to the metal film, which adversely affects abrasive particle removing performance in the cleaning step. To cope with it, in cleaning of semiconductor substrates having undergone the CMP process, when a contact angle of a surface of a metal film is adjusted, agglomerated abrasive particles are prevented from readily adhering to the metal film in light of surface potential, and also, when the agglomeration of abrasive particles is loosened to decrease the particle size of the abrasive particles and increase the hydrophilicity of the abrasive particles, the dispersibility of the abrasive particles in the cleaning liquid improves and this prevents the abrasive particles from readily adhering to the metal film, and as a result, performance of removing abrasive particles on a surface of a metal film is improved. The present inventor presumes as above.

The cleaning method of the invention is described in detail below.

[Cleaning Liquid]

The cleaning liquid used in the cleaning method of the invention (hereinafter also simply called "cleaning liquid") contains a chelating agent, a component A, and an anticorrosive. The cleaning liquid has a pH of more than 7 at 25° C. and shows alkaline properties.

Each component contained in the cleaning liquid is described below.

[Chelating Agent]

The cleaning liquid contains a chelating agent.

The chelating agent used in the cleaning liquid is a compound that has a function of chelating with metal contained in a residue such as abrasive particles in a cleaning step of a semiconductor substrate. In particular, preferred is a compound having in the molecule two or more functional groups (coordination groups) that form coordinate bonds with a metal ion.

Examples of the coordination group that the chelating agent has include an acid group and a cationic group. Examples of the acid group include a carboxyl group, a phosphonic acid group, a sulfo group, and a phenolic hydroxy group. One example of the cationic group is an amino group.

The chelating agent used in the cleaning liquid preferably has the acid group as the coordination group and more preferably has a carboxyl group or a phosphonic acid group.

Examples of the chelating agent include an organic chelating agent and an inorganic chelating agent.

The organic chelating agent is a chelating agent constituted of an organic compound, and examples thereof include a carboxylic acid-based chelating agent having a carboxyl group as the coordination group, a phosphonic acid-based chelating agent having a phosphonic acid group as the coordination group, and a polyamine-based chelating agent having only an amino group as the coordination group.

Examples of the inorganic chelating agent include a phosphoric acid-based chelating agent.

The chelating agent is preferably of low molecular weight. Specifically, the molecular weights of those chelating agents are each preferably not more than 600, more preferably not more than 450 and even more preferably not more than 300. The lower limit thereof is not particularly limited and is preferably not less than 85.

The number of carbon atoms of the chelating agent is preferably not more than 15, more preferably not more than 12 and even more preferably not more than 8. The lower limit thereof is not particularly limited and is preferably not less than 2.

<Carboxylic Acid-Based Chelating Agent>

The carboxylic acid-based chelating agent is a chelating agent having a carboxyl group as the coordination group in the molecule, and examples thereof include an aminopolycarboxylic acid-based chelating agent, an amino acid-based chelating agent, a hydroxy carboxylic acid-based chelating agent, and an aliphatic carboxylic acid-based chelating agent.

Examples of the aminopolycarboxylic acid-based chelating agent include butylene diamine tetraacetic acid, diethylenetriamine pentaacetic acid (DTPA), ethylenediamine tetrapropionic acid, triethylenetetramine hexaacetic acid, 1,3-diamino-2-hydroxypropane-N,N,N',N'-tetraacetic acid, propylenediamine tetraacetic acid, ethylenediamine tetraacetic acid (EDTA), trans-1,2-diaminocyclohexane tetraacetic acid (CyDTA), ethylenediamine diacetic acid, ethylenediamine dipropionic acid, 1,6-hexamethylene-diamine-N,N,N',N'-tetraacetic acid, N,N-bis(2-hydroxybenzyl)ethylenediamine-N,N-diacetic acid, diaminopropane tetraacetic acid, 1,4,7,10-tetraazacyclododecane-tetraacetic acid, diaminopropanol tetraacetic acid, (hydroxyethyl)ethylenediamine triacetic acid, and iminodiacetic acid (IDA).

Of these, DTPA, EDTA, CyDTA, or IDA is preferred, and DTPA is more preferred.

Examples of the amino acid-based chelating agent include glycine, serine, α-alanine (2-aminopropionic acid), β-alanine (3-aminopropionic acid), lysine, leucine, isoleucine, cysteine, cysteine, ethionine, threonine, tryptophan, tyrosine, valine, histidine, histidine derivatives, asparagine, aspartic acid, glutamine, glutamic acid, arginine, proline, methionine, sarcosine, phenylalanine, the compounds described in paragraphs [0021] to [0023] of JP 2016-086094 A, and salts thereof. For the histidine derivatives, the compounds described in JP 2015-165561 A, JP 2015-165562 A and the like can be applied, and the contents thereof are incorporated in the present specification. Examples of the salts include alkali metal salts such as a sodium salt and a potassium salt, ammonium salts, carbonates, and acetates.

Of these, glycine, histidine, cysteine, arginine, methionine, sarcosine, or alanine is preferred, and glycine is more preferred.

Examples of the hydroxy carboxylic acid-based chelating agent include malic acid, citric acid, glycolic acid, gluconic acid, heptonic acid, tartaric acid, and lactic acid, with preferred being gluconic acid, glycolic acid, malic acid, tartaric acid, or citric acid, and more preferred being gluconic acid or citric acid.

Examples of the aliphatic carboxylic acid-based chelating agent include oxalic acid, malonic acid, succinic acid, glutaric acid, adipic acid, pimelic acid, sebacic acid, and maleic acid.

For the carboxylic acid-based chelating agent, the aminopolycarboxylic acid-based chelating agent, the amino acid-based chelating agent, or the hydroxy carboxylic acid-based chelating agent is preferred, and the aminopolycarboxylic acid-based chelating agent or the amino acid-based chelating agent is more preferred.

<Phosphonic Acid-Based Chelating Agent>

The phosphonic acid-based chelating agent is a chelating agent having at least one phosphonic acid group in the molecule. Examples of the phosphonic acid-based chelating agent include compounds represented by Formulae (P1), (P2) and (P3) below.

[Chemical Formula 1]

(P1)

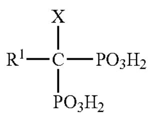

In the formula, X represents a hydrogen atom or a hydroxy group, and $R^1$ represents a hydrogen atom or an alkyl group having 1 to 10 carbon atoms.

The alkyl group having 1 to 10 carbon atoms represented by $R^1$ in Formula (P1) may be any of linear, branched and cyclic groups.

For $R^1$ in Formula (P1), an alkyl group having 1 to 6 carbon atoms is preferred, and a methyl group, an ethyl group, an n-propyl group, or an isopropyl group is more preferred.

It should be noted that n- represents a normal-type in specific examples of an alkyl group described in the present specification.

For X in Formula (P1), a hydroxy group is preferred.

For the phosphonic acid-based chelating agent represented by Formula (P1), preferred is ethylidenediphosphonic acid, 1-hydroxyethylidene-1,1'-diphosphonic acid (HEDPO), 1-hydroxypropylidene-1,1'-diphosphonic acid, or 1-hydroxybutylidene-1,1'-diphosphonic acid.

[Chemical Formula 2]

(P2)

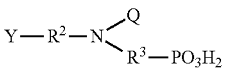

In the formula, Q represents a hydrogen atom or $R^3$—$PO_3H_2$, $R^2$ and $R^3$ each independently represent an alkylene group, and Y represents a hydrogen atom, —$R^3$—$PO_3H_2$, or a group represented by Formula (P4) below.

[Chemical Formula 3]

(P4)

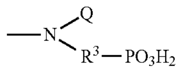

In the formula, Q and $R^3$ are the same as those in Formula (P2).

Examples of the alkylene group represented by $R^2$ in Formula (P2) include a linear or branched alkylene group having 1 to 12 carbon atoms.

For the alkylene group represented by $R^2$, a linear or branched alkylene group having 1 to 6 carbon atoms is preferred, a linear or branched alkylene group having 1 to 4 carbon atoms is more preferred, and an ethylene group is even more preferred.

For the alkylene group represented by $R^3$ in Formulae (P2) and (P4), examples thereof include a linear or branched alkylene group having 1 to 10 carbon atoms, with a linear or branched alkylene group having 1 to 4 carbon atoms being preferred, and a methylene group or an ethylene group being more preferred.

For Q in Formulae (P2) and (P4), —$R^3$—$PO_3H_2$ is preferred.

For Y in Formula (P2), —$R^3$—$PO_3H_2$ or the group represented by Formula (P4) is preferred, and the group represented by Formula (P4) is more preferred.

For the phosphonic acid-based chelating agent represented by Formula (P2), preferred is ethylaminobis(methylenephosphonic acid), dodecylaminobis(methylenephosphonic acid), nitrilotris(methylenephosphonic acid) (NTPO), ethylenediamine bis(methylenephosphonic acid) (EDDPO), 1,3-propylenediamine bis(methylenephosphonic acid), ethylenediamine tetra(methylenephosphonic acid) (EDTPO), ethylenediamine tetra(ethylenephosphonic acid), 1,3-propylenediamine tetra(methylenephosphonic acid) (PDTMP), 1,2-diaminopropane tetra(methylenephosphonic acid), or 1,6-hexamethylenediamine tetra(methylenephosphonic acid).

[Chemical Formula 4]

(P3)

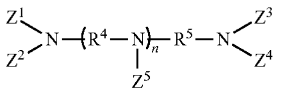

In the formula, $R^4$ and $R^5$ each independently represent an alkylene group having 1 to 4 carbon atoms, n represents an integer of 1 to 4, and at least four of $Z^1$ to $Z^4$ and n moieties of $Z^5$s represent a phosphonic acid group-containing alkyl group while the remainder represents an alkyl group.

The alkylene group having 1 to 4 carbon atoms represented by $R^4$ and $R^5$ in Formula (P3) may be linear or branched. Examples of the alkylene group having 1 to 4 carbon atoms represented by $R^4$ and $R^5$ include a methylene group, an ethylene group, a propylene group, a trimethylene group, an ethylmethylene group, a tetramethylene group, a 2-methylpropylene group, a 2-methyltrimethylene group, and an ethylethylene group, with an ethylene group being preferred.

For n in Formula (P3), 1 or 2 is preferred.

Examples of an alkyl group in the alkyl group and the phosphonic acid group-containing alkyl group represented by $Z^1$ to $Z^5$ in Formula (P3) include a linear or branched alkyl group having 1 to 4 carbon atoms, with a methyl group being preferred.

The number of phosphonic acid groups in the phosphonic acid group-containing alkyl group represented by $Z^1$ to $Z^5$ is preferably 1 or 2 and more preferably 1.

Examples of the phosphonic acid group-containing alkyl group represented by $Z^1$ to $Z^5$ include a linear or branched alkyl group having 1 to 4 carbon atoms and one or two phosphonic acid groups, with a (mono)phosphonomethyl group or a (mono)phosphonoethyl group being preferred, and a (mono)phosphonomethyl group being more preferred.

For $Z^1$ to $Z^5$ in Formula (P3), it is preferable that each of $Z^1$ to $Z^4$ and n moieties of $Z^5$s be the foregoing phosphonic acid group-containing alkyl group.

For the phosphonic acid-based chelating agent represented by Formula (P3), preferred is diethylenetriamine penta(methylenephosphonic acid) (DEPPO), diethylenetriamine penta(ethylenephosphonic acid), triethylenetetramine hexa(methylenephosphonic acid), or triethylenetetramine hexa(ethylenephosphonic acid).

For the phosphonic acid-based chelating agent used in the cleaning liquid, not only the phosphonic acid-based chelating agents represented by Formulae (P1), (P2) and (P3) above but also the compounds described in paragraphs [0026] to [0036] of the description of WO 2018/020878 and the compounds ((co)polymers) described in paragraphs [0031] to [0046] of the description of WO 2018/030006 can be applied, and the contents thereof are incorporated in the present specification.

The number of phosphonic acid groups in the phosphonic acid-based chelating agent is preferably 2 to 5, more preferably 2 to 4, and even more preferably 3 or 4.

The number of carbon atoms of the phosphonic acid-based chelating agent is preferably not more than 15, more preferably not more than 12 and even more preferably not more than 8. The lower limit thereof is not particularly limited and is preferably not less than 3.

For the phosphonic acid-based chelating agent, those compounds listed as preferable specific examples of the phosphonic acid-based chelating agents represented by Formulae (P1), (P2) and (P3) above are preferred, HEDPO, NTPO, EDTPO, or DEPPO is more preferred, and HEDPO is even more preferred.

The phosphonic acid-based chelating agents may be used singly or in combination of two or more.

A commercial phosphonic acid-based chelating agent may contain water such as distilled water, deionized water and ultrapure water in addition to a phosphonic acid-based chelating agent, and it is no problem to use such a phosphonic acid-based chelating agent containing water.

<Polyamine-Based Chelating Agent>

The polyamine-based chelating agent is a chelating agent having only an amino group as the coordination group in the molecule.

Examples of the polyamine-based chelating agent include lower alkylene diamines such as ethylenediamine (EDA), 1,3-propanediamine (PDA), 1,2-propanediamine, 1,3-butanediamine, and 1,4-butanediamine, and polyalkyl polyamines such as diethylenetriamine (DETA), triethylenetetramine (TETA), bis(aminopropyl)ethylenediamine (BAPEDA), and tetraethylenepentamine.

Of these, the lower alkylene diamines are preferred, and 1,4-butanediamine is more preferred.

Another example of the polyamine-based chelating agent is at least one biguanide compound selected from the group consisting of a biguanide group-containing compound and a salt thereof.

The number of biguanide groups that the biguanide compound has is not particularly limited and may be plural.

For the biguanide compound, the compounds described in paragraphs [0034] to [0055] of JP 2017-504190 A can be applied, and the contents thereof are incorporated in the present specification.

For the biguanide group-containing compound, preferred is ethylene dibiguanide, propylene dibiguanide, tetramethylene dibiguanide, pentamethylene dibiguanide, hexamethylene dibiguanide, heptamethylene dibiguanide, octamethylene dibiguanide, 1,1'-hexamethylenebis(5-(p-chlorophenyl)biguanide) (chlorhexidine), 2-(benzyloxymethyl)pentane-1,5-bis(5-hexylbiguanide), 2-phenylthiomethyl)pentane-1,5-bis(5-phenethylbiguanide), 3-(phenylthio)hexane-1,6-bis(5-hexylbiguanide), 3-(phenylthio)hexane-1,6-bis(5-cyclohexylbiguanide), 3-(benzylthio)hexane-1,6-bis(5-hexylbiguanide), or 3-(benzylthio)hexane-1,6-bis(5-cyclohexylbiguanide), and more preferred is chlorhexidine.

For the salt of the biguanide group-containing compound, a hydrochloride, an acetate, or a gluconate is preferred.

<Phosphoric Acid-Based Chelating Agent>

Examples of the phosphoric acid-based chelating agent that is an inorganic chelating agent include condensed phosphoric acids and salts thereof, more specifically, pyrophosphoric acid and salts thereof, metaphosphoric acid and salts thereof, tripolyphosphoric acid and salts thereof, and hexametaphosphoric acid and salts thereof.

For the chelating agent, preferred is the phosphonic acid-based chelating agent or the carboxylic acid-based chelating agent (more preferably, the aminopolycarboxylic acid-based chelating agent or the hydroxy carboxylic acid-based chelating agent), more preferred is the phosphonic acid-based chelating agent or the aminopolycarboxylic acid-based chelating agent, and even more preferred is the phosphonic acid-based chelating agent.

The chelating agents may be used singly or in combination of two or more.

The chelating agent content of the cleaning liquid is not particularly limited and is preferably not less than 0.05 mass %, more preferably not less than 0.1 mass % and even more preferably not less than 0.2 mass % based on the total mass of the cleaning liquid because this leads to more excellent abrasive particle removing performance. The upper limit thereof is not particularly limited and is preferably not more than 10 mass %, more preferably not more than 5 mass %, and even more preferably not more than 3 mass % based on the total mass of the cleaning liquid because this leads to excellent corrosion prevention performance with respect to a metal substrate.

Further, the chelating agent content is preferably not less than 0.5 mass %, more preferably not less than 1.0 mass % and even more preferably not less than 2.0 mass % based on the total mass of components, excluding a solvent, in the cleaning liquid. The upper limit thereof is not particularly limited and is preferably not more than 50 mass %, more preferably not more than 20 mass % and even more preferably not more than 10 mass % based on the total mass of components, excluding a solvent, in the cleaning liquid.

In this specification, the expression "the total mass of components, excluding a solvent, in the cleaning liquid" refers to the sum of the contents of all components contained in the cleaning liquid, excluding a solvent. The simple term "solvent" includes both water and an organic solvent.

[Component A]

The component A contained in the cleaning liquid is an amine compound that is at least one selected from the group consisting of a primary amine having a primary amino group ($—NH_2$) in the molecule, a secondary amine having a secondary amino group (>NH) in the molecule, and a tertiary amine having a tertiary amino group (>N—) in the molecule, the first acidity constant of the conjugated acid (hereinafter also referred to as "pKa1") of the amine compound being not less than 8.0.

In the present specification, compounds included in the foregoing chelating agent and the anticorrosive to be described later are not included in the component A.

The component A is not particularly limited as long as it is a compound or its salt that has a group selected from the primary amino group, the secondary amino group, and the tertiary amino group (hereinafter also sometimes collectively called "primary to tertiary amino groups") in the molecule and has a pKa1 of not less than 8.0.

Examples of salts of the primary to tertiary amines include a salt of an inorganic acid in which at least one non-metal selected from the group consisting of Cl, S, N and P is bonded to hydrogen, and preferred is a hydrochloride, a sulfate, or a nitrate.

The pKa1 of the component A is not less than 8.0. The pKa1 of the component A being not less than 8.0 results in improved abrasive particle removing performance. Although not clear, the reason thereof is presumed to be that the nucleophile content of the cleaning liquid increases, and this allows efficient removal through reactions and complex formation with metal ions.

The pKa1 of the component A is preferably not less than 9.0 and more preferably not less than 9.5. The upper limit thereof is not particularly limited and is preferably not more than 12.0.

In this specification, the first acidity constant of the conjugated acid (pKa1) is measured using SC-Database (http://acadsoft.co.uk/scdbase/SCDB_software/scdb_download.htm).

Examples of the component A include an amino alcohol and an alicyclic amine compound, as well as a monoamine compound other than the amino alcohol and the alicyclic amine compound.

<Amino Alcohol>

The amino alcohol is, of the primary to tertiary amines, a compound further having at least one hydroxylalkyl group in the molecule. The amino alcohol may have any of primary to tertiary amino groups and preferably has a primary amino group.

It is preferable for the amino alcohol that a carbon atom situated at the α position of a relevant one of the primary to tertiary amino groups is bonded not to a hydrogen atom but to three organic groups because this leads to excellent temporal stability.

Examples of the amino alcohol include monoethanolamine (MEA) (pKa1: 9.55), 2-amino-2-methyl-1-propanol (AMP) (pKa1: 9.72), diethanolamine (DEA) (pKa1: 8.88), diethylene glycol amine (DEGA) (pKa1: 9.02), tris(hydroxymethyl)aminomethane (Tris) (pKa1: 8.30), and 2-(methylamino)-2-methyl-1-propanol (N-MAMP) (pKa1: 9.70).

Of these, AMP, N-MAMP, MEA, DEA, or Tris is preferred, and AMP or MEA is more preferred.

When the cleaning liquid contains the amino alcohol as the component A, one amino alcohol may be contained alone, or two or more amino alcohols may be contained in combination.

<Alicyclic Amine Compound>

The alicyclic amine compound is not particularly limited as long as it is a compound having a non-aromatic heterocyclic ring in which at least one of atoms constituting the ring is a nitrogen atom.

Examples of the alicyclic amine compound include a piperazine compound and a cyclic amidine compound.

The piperazine compound is a compound having a six-membered heterocyclic ring (piperazine ring) in which opposed —CH— groups in a cyclohexane ring are substituted with nitrogen atoms.

The piperazine compound may have a substituent on the piperazine ring. Examples of the substituent include a hydroxy group, an alkyl group having 1 to 4 carbon atoms that may have a hydroxy group, and an aryl group having 6 to 10 carbon atoms.

Examples of the piperazine compound include piperazine, 1-methylpiperazine, 1-ethylpiperazine, 1-propylpiperazine, 1-butylpiperazine, 2-methylpiperazine, 1,4-dimethylpiperazine, 2,5-dimethylpiperazine, 2,6-dimethylpiperazine, 1-phenylpiperazine, 2-hydroxypiperazine, 2-hydroxymethylpiperazine, 1-(2-hydroxyethyl)piperazine (HEP), N-(2-aminoethyl)piperazine (AEP), 1,4-bis(2-hydroxyethyl)piperazine (BHEP), 1,4-bis(2-aminoethyl)piperazine (BAEP), and 1,4-bis(3-aminopropyl)piperazine (BAPP), with preferred being piperazine, 1-methylpiperazine, 2-methylpiperazine, HEP, AEP, BHEP, BAEP, or BAPP, and more preferred being piperazine.

The cyclic amidine compound is a compound having a heterocyclic ring including an amidine structure (>N—C═N—) in the ring.

The number of atoms constituting the heterocyclic ring of the cyclic amidine compound is not particularly limited and is preferably 5 or 6 and more preferably 6.

Examples of the cyclic amidine compound include diazabicycloundecene (1,8-diazabicyclo[5.4.0]undec-7-ene: DBU), diazabicyclononene (1,5-diazabicyclo[4.3.0]non-5-ene: DBN), 3,4,6,7,8,9,10,11-octahydro-2H-pyrimido[1,2-a]azocine, 3,4,6,7,8,9-hexahydro-2H-pyrido[1,2-a]pyrimidine, 2,5,6,7-terrahydro-3H-pyrrolo[1,2-a]imidazole, 3-ethyl-2,3,4,6,7,8,9,10-octahydropyrimido[1,2-a]azepine, and creatinine.

Examples of the alicyclic amine compound include, in addition to the foregoing examples, a compound having a five-membered heterocyclic ring with no aromatic properties such as 1,3-dimethyl-2-imidazolidinone or imidazolidinethione, and a compound having a seven-membered ring containing a nitrogen atom(s).

<Monoamine Compound>

Examples of the monoamine compound other than the amino alcohol and the alicyclic amine compound include benzylamine, n-butylamine, 3-methoxypropylamine, tert-butylamine, n-hexylamine, cyclohexylamine, n-octylamine, 2-ethylhexylamine, and 4-(2-aminoethyl)morpholine (AEM).

For the component A, the amine compounds described in paragraphs [0034] to [0056] of the description of WO 2013/162020 can be applied, and the contents thereof are incorporated in the present specification.

The cleaning liquid may contain one component A alone or two or more components A in combination.

The component A content of the cleaning liquid is not particularly limited and is preferably not less than 0.5 mass %, more preferably not less than 1 mass % and even more preferably not less than 2 mass % based on the total mass of the cleaning liquid because this leads to more excellent abrasive particle removing performance. The upper limit thereof is not particularly limited and is preferably not more than 20 mass %, more preferably not more than 10 mass %, and even more preferably not more than 5 mass % based on the total mass of the cleaning liquid because this leads to excellent corrosion prevention performance with respect to a metal substrate.

Further, the component A content is preferably not less than 10 mass %, more preferably not less than 40 mass % and even more preferably not less than 60 mass % based on the total mass of components, excluding a solvent, in the cleaning liquid. The upper limit thereof is not particularly limited and is preferably not more than 99 mass %, more preferably not more than 98 mass % and even more preferably not more than 95 mass % based on the total mass of components, excluding a solvent, in the cleaning liquid.

[Anticorrosive]

The cleaning liquid contains an anticorrosive.

The anticorrosive used in the cleaning liquid is not particularly limited as long as it is a compound having a function of preventing corrosion of a polished surface of a semiconductor substrate (particularly, a polished surface of a metal film containing copper, tungsten, or cobalt) polished through CMP in a cleaning step of the semiconductor substrate.

Examples of the anticorrosive include a compound B represented by Formula (1) below, a nitrogen-containing heteroaromatic compound, a reducing agent, and a quaternary ammonium compound.

<Compound B>

The compound B is a compound represented by Formula (1) below.

[Chemical Formula 5]

(1)

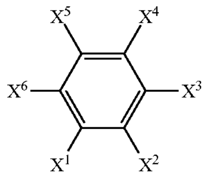

In Formula (1), $X^1$ and $X^2$ each independently represent a hydrophilic group.

$X^3$ to $X^6$ each independently represent a hydrogen atom or a substituent, and at least one of $X^3$ to $X^6$ represents a hydrophilic group.

Adjacent two of $X^3$ to $X^6$ may be bonded together to form a ring that may have a substituent.

Examples of the hydrophilic group include a carboxyl group, an amino group, a hydroxy group, and a sulfo group, with preferred being a carboxyl group, a hydroxy group, or a sulfo group.

Examples of the substituent include an alkyl group having 1 to 6 carbon atoms and a hydrophilic group. The alkyl group having 1 to 6 carbon atoms may be any of linear, branched and cyclic groups.

Examples of the ring that may be formed by bonding of adjacent two of $X^3$ to $X^6$ include an aromatic ring (which may be monocyclic or polycyclic; preferably a benzene ring or a pyridine ring). Examples of the substituent that the above ring may have include an alkyl group having 1 to 6 carbon atoms and a hydrophilic group, with preferred being a carboxyl group, an amino group, or a hydroxy group.

For the compound B, preferred is a compound (hereinafter also called "compound B1") where $X^1$ and $X^2$ represent a hydrophilic group, at least one of $X^1$ and $X^2$ represents a carboxyl group, an amino group, or a hydroxy group, one of $X^3$ to $X^6$ represents a hydrophilic group (more preferably, a carboxyl group, an amino group, a hydroxy group, or a sulfo group), and the remaining three of $X^3$ to $X^6$ represent a hydrogen atom. In particular, more preferred is, among compounds B1, a compound where one of $X^4$ and $X^5$ represents a hydrophilic group (more preferably, a carboxyl group, an amino group, a hydroxy group, or a sulfo group), while $X^3$, $X^6$, and the remaining one of $X^4$ and $X^5$ represent a hydrogen atom.

Examples of the compound B (compound B1) include: phthalic acid derivatives in which both $X^1$ and $X^2$ represent a carboxyl group, as exemplified by trimellitic acid, 4-hydroxyphthalic acid, 4-aminophthalic acid, and 4-sulfophthalic acid; salicylic acid derivatives in which $X^1$ represents a hydroxy group and $X^2$ represents a carboxyl group, as exemplified by 5-sulfosalicylic acid, 2,5-dihydroxybenzoic acid, 5-aminosalicylic acid, and 4-hydroxyisophthalic acid; anthranilic acid derivatives in which $X^1$ represents an amino group and $X^2$ represents a carboxyl group, as exemplified by 5-hydroxyanthranilic acid, 2,5-diaminobenzoic acid, and 5-sulfoanthranilic acid; o-aminophenol derivatives in which $X^1$ represents a hydroxy group and $X^2$ represents an amino group, as exemplified by amidol, 3-amino-4-hydroxybenzoic acid, and 3-amino-4-hydroxybenzenesulfonic acid; and 1,3-phenylenediamine-4-sulfonic acid.

Of these, preferred is 4-sulfophthalic acid, 5-sulfosalicylic acid, 2,5-dihydroxybenzoic acid, 5-aminosalicylic acid, 4-hydroxyisophthalic acid, 5-hydroxyanthranilic acid, 2,5-diaminobenzoic acid, 5-sulfoanthranilic acid, amidol, 3-amino-4-hydroxybenzoic acid, or 3-amino-4-hydroxybenzenesulfonic acid, and more preferred is 4-sulfophthalic acid, 5-sulfosalicylic acid, 2,5-dihydroxybenzoic acid, or 5-sulfoanthranilic acid.

The compounds B may be used singly or in combination of two or more.

When the cleaning liquid contains the compound B, the compound B content is preferably 0.001 to 10 mass %, more preferably 0.01 to 5 mass % and even more preferably 0.01 to 3 mass % based on the total mass of the cleaning liquid because this leads to more excellent effectiveness of the invention.

Further, when the cleaning liquid contains the compound B, the compound B content is preferably 0.01 to 50 mass %, more preferably 0.1 to 30 mass % and even more preferably 0.2 to 15 mass % based on the total mass of components, excluding a solvent, in the cleaning liquid.

<Nitrogen-Containing Heteroaromatic Compound>

The nitrogen-containing heteroaromatic compound is not particularly limited as long as it is a compound having a heteroaromatic ring (nitrogen-containing heteroaromatic ring) in which at least one of atoms constituting the ring is a nitrogen atom.

Examples of the nitrogen-containing heteroaromatic compound include, but not limited to, an azole compound, a pyridine compound, a pyrazine compound, and a pyrimidine compound.

The azole compound is a compound having a five-membered heterocyclic ring containing at least one nitrogen atom and having aromatic properties. The number of nitrogen atoms included in the five-membered heterocyclic ring of the azole compound is not particularly limited, and is preferably 2 to 4 and more preferably 3 or 4.

The azole compound may have a substituent on the five-membered heterocyclic ring. Examples of the substituent include a hydroxy group, a carboxyl group, a mercapto group, an amino group, an alkyl group having 1 to 4 carbon atoms that may have an amino group, and a 2-imidazolyl group.

Examples of the azole compound include an imidazole compound, a pyrazole compound, a thiazole compound, a triazole compound, and a tetrazole compound.

The imidazole compound is a compound with aromatic properties having a five-membered heterocyclic ring (imidazole ring) containing two nitrogen atoms at the first and third positions.

Examples of the imidazole compound include imidazole, 1-methylimidazole, 2-methylimidazole, 5-methylimidazole, 1,2-dimethylimidazole, 2-mercaptoimidazole, 4,5-dimethyl-2-mercaptoimidazole, 4-hydroxyimidazole, 2,2'-biimidazole, 4-imidazolecarboxylic acid, histamine, benzimidazole, and 2-aminobenzimidazole.

The pyrazole compound is a compound with aromatic properties having a five-membered heterocyclic ring (pyrazole ring) containing two nitrogen atoms at the first and second positions.

Examples of the pyrazole compound include pyrazole, 4-pyrazolecarboxylic acid, 1-methylpyrazole, 3-methylpyrazole, 3-amino-5-hydroxypyrazole, 3-amino-5-methylpyrazole, 3-aminopyrazole, and 4-aminopyrazole.

The thiazole compound is a compound with aromatic properties having a five-membered heterocyclic ring (thiazole ring) containing a sulfur atom at the first position and a nitrogen atom at the third position.

Examples of the thiazole compound include 2,4-dimethylthiazole, benzothiazole, and 2-mercaptobenzothiazole.

The triazole compound is a compound with aromatic properties having a five-membered heterocyclic ring (triazole ring) containing three nitrogen atoms.

Examples of the triazole compound include 1,2,4-triazole, 3-methyl-1,2,4-triazole, 3-amino-1,2,4-triazole, 1,2,3-triazole, 1-methyl-1,2,3-triazole, benzotriazole, 1-hydroxybenzotriazole, 1-dihydroxypropylbenzotriazole, 2,3-dicarboxypropylbenzotriazole, 4-hydroxybenzotriazole, 4-carboxybenzotriazole, and 5-methylbenzotriazole.

The tetrazole compound is a compound with aromatic properties having a five-membered heterocyclic ring (tetrazole ring) containing four nitrogen atoms.

Examples of the tetrazole compound include 1H-tetrazole (1,2,3,4-tetrazole), 5-methyl-1,2,3,4-tetrazole, 5-amino-1,2,3,4-tetrazole, 1,5-pentamethylenetetrazole, 1-phenyl-5-mercaptotetrazole, and 1-(2-dimethylaminoethyl)-5-mercaptotetrazole.

The pyridine compound is a compound having a six-membered heterocyclic ring (pyridine ring) containing one nitrogen atom and having aromatic properties.

Specific examples of the pyridine compound include pyridine, 3-aminopyridine, 4-aminopyridine, 3-hydroxypyridine, 4-hydroxypyridine, 2-acetamidopyridine, 2-cyanopyridine, 2-carboxypyridine, and 4-carboxypyridine.

The pyrimidine compound is a compound with aromatic properties having a six-membered heterocyclic ring (pyrimidine ring) containing two nitrogen atoms at the meta positions.

Examples of the pyrimidine compound include pyrimidine, 2-methylpyrimidine, 2-aminopyrimidine, 4,6-dimethylpyrimidine, and adenine, with 2-aminopyrimidine or adenine being preferred.

The pyrazine compound is a compound with aromatic properties having a six-membered heterocyclic ring (pyrazine ring) containing two nitrogen atoms at the para positions.

Examples of the pyrazine compound include pyrazine, 2-methylpyrazine, 2,5-dimethylpyrazine, 2,3,5-trimethylpyrazine, 2,3,5,6-tetramethylpyrazine, 2-ethyl-3-methylpyrazine, and 2-amino-5-methylpyrazine.

For the nitrogen-containing heteroaromatic compound, the azole compound or the pyrimidine compound is preferred, the pyrazole compound or the pyrimidine compound is more preferred, 2-aminopyrimidine, adenine, pyrazole, or 3-amino-5-methylpyrazole is even more preferred, and 3-amino-5-methylpyrazole is particularly preferred.

The nitrogen-containing heteroaromatic compounds may be used singly or in combination of two or more.

When the cleaning liquid contains the nitrogen-containing heteroaromatic compound, the content of the nitrogen-containing heteroaromatic compound in the cleaning liquid is not particularly limited and is preferably 0.01 to 10 mass % and more preferably 0.05 to 5 mass % based on the total mass of the cleaning liquid.

Further, when the cleaning liquid contains the nitrogen-containing heteroaromatic compound, the content thereof is preferably 0.1 to 30 mass % and more preferably 0.5 to 10 mass % based on the total mass of components, excluding a solvent, in the cleaning liquid.

<Reducing Agent>

The reducing agent is a compound having an oxidative effect and having the function of oxidizing $OH^-$ ions or dissolved oxygen contained in the cleaning liquid, and is also called an oxygen scavenger.

The reducing agent used in the cleaning liquid is not particularly limited, and examples thereof include a hydroxylamine compound, an ascorbic acid compound, a catechol compound, and a reducing sulfur compound.

(Hydroxylamine Compound)

The cleaning liquid may contain a hydroxylamine compound as the reducing agent.

The hydroxylamine compound refers to at least one selected from the group consisting of a hydroxylamine ($NH_2OH$), a hydroxylamine derivative, and their salts.

The hydroxylamine derivative refers to a compound of hydroxylamine ($NH_2OH$) obtained through substitution with at least one organic group.

A salt of the hydroxylamine or the hydroxylamine derivative may be an inorganic or organic acid salt of the hydroxylamine or the hydroxylamine derivative. For the salt of the hydroxylamine or the hydroxylamine derivative, preferred is a salt thereof with an inorganic acid in which at least one non-metal selected from the group consisting of Cl, S, N and P is bonded to hydrogen, and more preferred is a hydrochloride, a sulfate, or a nitrate.

One example of the hydroxylamine compound is a compound represented by Formula (2).

[Chemical Formula 6]

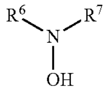

(2)

In the formula, $R^6$ and $R^7$ each independently represent a hydrogen atom or an alkyl group having 1 to 6 carbon atoms.

The alkyl groups each having 1 to 6 carbon atoms represented by $R^6$ and $R^7$ may be any of linear, branched and cyclic groups and may be the same or different.

For $R^6$ and $R^7$ in Formula (2), the alkyl group having 1 to 6 carbon atoms is preferred, an ethyl group or an n-propyl group is more preferred, and an ethyl group is even more preferred.

For the hydroxylamine compound, N-ethylhydroxylamine, DEHA, or N-n-propylhydroxylamine is preferred, and DEHA is more preferred.

The hydroxylamine compounds may be used singly or in combination of two or more. As the hydroxylamine compound, a commercial product or a composite suitably synthesized by a known method may be used.

(Ascorbic Acid Compound)

The cleaning liquid may contain an ascorbic acid compound as the reducing agent.

The ascorbic acid compound refers to at least one selected from the group consisting of ascorbic acid (preferably, L-ascorbic acid), an ascorbic acid derivative, and their salts.

Examples of the ascorbic acid derivative include an ascorbic acid phosphoric acid ester and an ascorbic acid sulfuric acid ester.

(Catechol Compound)

The cleaning liquid may contain a catechol compound as the reducing agent.

The catechol compound refers to at least one selected from the group consisting of pyrocatechol(benzene-1,2-diol) and a catechol derivative.

The catechol derivative refers to a compound of pyrocatechol obtained through substitution with at least one substituent. Examples of the substituent that the catechol derivative has include a hydroxy group, a carboxyl group, a carboxylic acid ester group, a sulfo group, a sulfonic acid ester group, an alkyl group (preferably with 1 to 6 carbon atoms and more preferably with 1 to 4 carbon atoms), and an aryl group (preferably a phenyl group). The carboxyl group and the sulfo group that the catechol derivative has as a substituent may be a salt of a cation. The alkyl group and the aryl group that the catechol derivative has as a substituent may further have a substituent.

Examples of the catechol compound include pyrocatechol, 4-tert-butylcatechol, pyrogallol, gallic acid, methyl gallate, 1,2,4-benzenetriol, and tiron.

(Reducing Sulfur Compound)

The cleaning liquid may contain a reducing sulfur compound as the reducing agent.

The reducing sulfur compound is not particularly limited as long as it contains a sulfur atom and functions as the reducing agent, and examples thereof include mercaptosuccinic acid, dithiodiglycerol, bis(2,3-dihydroxypropylthio) ethylene, sodium 3-(2,3-dihydroxypropylthio)-2-methyl-propylsulfonate, 1-thioglycerol, sodium 3-mercapto-1-propanesulfonate, 2-mercaptoethanol, thioglycolic acid, and 3-mercapto-1-propanol.

Of these, a compound having an SH group (mercapto compound) is preferred, 1-thioglycerol, sodium 3-mercapto-1-propanesulfonate, 2-mercaptoethanol, 3-mercapto-1-propanol, or thioglycolic acid is more preferred, and 1-thioglycerol or thioglycolic acid is even more preferred.

For the reducing agent, the hydroxylamine compound or the ascorbic acid compound is preferred, and DEHA or ascorbic acid is more preferred.

The reducing agents may be used singly or in combination of two or more. The cleaning liquid preferably contains two or more reducing agents because this leads to more excellent corrosion prevention performance with respect to various metal films.

When the cleaning liquid contains the reducing agent, the reducing agent content is not particularly limited and is preferably 0.1 to 20 mass % and more preferably 0.2 to 5 mass % based on the total mass of the cleaning liquid.

Further, when the cleaning liquid contains the reducing agent, the content thereof is preferably 1.0 to 50 mass % and more preferably 3.0 to 30 mass % based on the total mass of components, excluding a solvent, in the cleaning liquid.

Those reducing agents for use may be commercial products or composites synthesized by known methods.

<Quaternary Ammonium Compound>

The quaternary ammonium compound is not particularly limited as long as it is a quaternary ammonium cation-containing compound in which a nitrogen atom is attached to four hydrocarbon groups (preferably, alkyl groups) through substitution. Examples of the quaternary ammonium compound include quaternary ammonium hydroxide, quaternary ammonium fluoride, quaternary ammonium bromide, quaternary ammonium iodide, quaternary ammonium acetate, and quaternary ammonium carbonate.

It is preferable for the cleaning liquid to contain the quaternary ammonium compound because this leads to more excellent performance of removing abrasive particles on a surface of a metal film (particularly a Co-containing metal film).

For the quaternary ammonium compound, preferred is quaternary ammonium hydroxide represented by Formula (3):

$$(R^8)_4N^+OH^- \qquad (3)$$

where $R^8$ represents an alkyl group that may have a hydroxy group or a phenyl group as a substituent. Four $R^8$s may be the same or different.

For the alkyl group represented by $R^8$, an alkyl group having 1 to 4 carbon atoms is preferred, and a methyl group or an ethyl group is more preferred.

For the alkyl group that may have a hydroxy group or a phenyl group as represented by $R^8$, preferred is a methyl group, an ethyl group, a propyl group, a butyl group, a 2-hydroxyethyl group, or a benzyl group, and more preferred is a methyl group, an ethyl group, or a 2-hydroxyethyl group.

Examples of the quaternary ammonium compound include tetramethylammonium hydroxide (TMAH), trimethylethylammonium hydroxide (TMEAH), diethyldimethylammonium hydroxide (DEDMAH), methyltriethylammonium hydroxide (MTEAH), tetraethylammonium hydroxide (TEAH)), tetrapropylammonium hydroxide (TPAH), tetrabutylammonium hydroxide (TBAH), 2-hydroxyethyl trimethylammonium hydroxide (choline), bis(2-hydroxyethyl) dimethylammonium hydroxide, tri(2-hydroxyethyl) methylammonium hydroxide, tetra(2-hydroxyethyl) ammonium hydroxide, benzyltrimethylammonium hydroxide (BTMAH), and cetyltrimethylammonium hydroxide.

As the quaternary ammonium compound other than the foregoing specific examples, the compounds described in paragraph [0021] of JP 2018-107353 A can be applied, and the contents thereof are incorporated in the present specification.

For the quaternary ammonium compound used for the cleaning liquid, TMAH, TMEAH, TEAH, TPAH, TBAH, choline, or bis(2-hydroxyethyl)dimethylammonium hydroxide is preferred, and TMEAH, TEAH, TPAH, or TBAH is more preferred.

It is preferable for the cleaning liquid to contain a quaternary ammonium compound having an asymmetric structure because this leads to more excellent performance of removing abrasive particles on a surface of a metal film (particularly a W-containing metal film). The quaternary ammonium compound "having an asymmetric structure" means that four hydrocarbon groups attached to a nitrogen atom through substitution are different from one another. Examples of the quaternary ammonium compound having an asymmetric structure include TMEAH, DEDMAH, MTEAH, choline, and bis(2-hydroxyethyl)dimethylammonium hydroxide.

The quaternary ammonium compounds may be used singly or in combination of two or more.

When the cleaning liquid contains the quaternary ammonium compound, the content thereof is preferably 0.05 to 15 mass % and more preferably 0.1 to 10 mass % based on the total mass of the cleaning liquid.

Further, when the cleaning liquid contains the quaternary ammonium compound, the content thereof is preferably 0.5 to 50 mass % and more preferably 1.0 to 20 mass % based on the total mass of components, excluding a solvent, in the cleaning liquid.

The cleaning liquid may contain another anticorrosive different from the foregoing components.

Examples of such another anticorrosive include sugars such as fructose, glucose, and ribose, polyol compounds such as ethylene glycol, propylene glycol, and glycerin, polycarboxylic acid compounds such as polyacrylic acid, polymaleic acid, and copolymers thereof, polyvinylpyrrolidone, cyanuric acid, barbituric acid and its derivatives, glucuronic acid, squaric acid, α-keto acid, adenosine and its derivatives, a purine compound and its derivatives, phenanthroline, resorcinol, hydroquinone, nicotinamide and its derivatives, flavonol and its derivatives, anthocyanin and its derivatives, and combinations thereof.

One example of a preferable anticorrosive is a compound with a rigid skeleton structure, the compound containing two or more functional groups having a function of forming a coordination bond with metal (i.e., two or more coordination sites) and further containing at least one hydrophilic group at a position opposed to a site of coordination with the metal in the skeleton structure.

Owing to the use of such an anticorrosive having two or more coordination sites and at least one hydrophilic group at positions opposed across a rigid skeleton structure, it is possible to allow the hydrophilic group to appear on a surface side opposite from a metal film side when the anticorrosive adheres to a surface of the metal film in a cleaning step, so that re-adhesion of abrasive particles, which have been agglomerated in a CMP step, to the metal film is suppressed, thus improving abrasive particle removing performance.

Examples of the rigid skeleton structure include aromatic rings such as an aromatic hydrocarbon ring, and a nitrogen-containing heteroaromatic ring that the above nitrogen-containing heteroaromatic compound has. Examples of the aromatic hydrocarbon ring include a benzene ring and an anthracene ring. Examples of the nitrogen-containing heteroaromatic ring include nitrogen-containing five-membered heterocyclic rings such as an imidazole ring, a pyrazole ring, a thiazole ring, a triazole ring, and a tetrazole ring, and nitrogen-containing six-membered heterocyclic rings such as a pyridine ring, a pyrazine ring, and a pyrimidine ring.

One example of the positional relationship between two or more coordination sites and at least one hydrophilic substituent in the above compound is that, when the rigid skeleton structure is a five-membered aromatic ring, at least one coordination site and at least one hydrophilic group are situated at the first and third positions of the five-membered ring, respectively. Another example thereof is that, when the rigid skeleton structure is a six-membered aromatic ring, at least one coordination site and at least one hydrophilic group are situated at the para positions or at the meta positions.

The coordination sites in the compound may have a coordination group that may be contained in the foregoing chelating agent or a nitrogen atom that is a constituent of a nitrogen-containing heterocyclic ring.

The coordination group that the compound has at a coordination site and the hydrophilic group situated at a position opposed to a coordination site across the rigid skeleton structure are not particularly limited, and examples thereof include an acid group and a cationic group, with preferred being a carboxyl group, a phenolic hydroxy group, an amino group, or a sulfo group, and more preferred being a carboxyl group, a phenolic hydroxy group, or an amino group.

The number of hydrophilic groups situated at positions opposed to coordination sites across the rigid skeleton structure is preferably one. This is because, when the number of hydrophilic groups as above is two or more, the hydrophilic groups may react with metal contained in residual matter such as abrasive particles and thereby form a network structure with the residual matter, and this may cause lower performance of cleaning the residual matter.

Examples of the preferable anticorrosive include the compound B represented by Formula (1) above (more preferably, the compound B1), and the nitrogen-containing heteroaromatic compound (more preferably, a nitrogen-containing heteroaromatic compound having two or more nitrogen atoms that are constituents of a nitrogen-containing heterocyclic ring and further having at least one hydrophilic group).

Preferable examples of the compound B1 include those listed as preferable compounds B1 in the section describing the compound B above.

For the nitrogen-containing heteroaromatic compound having two or more nitrogen atoms that are constituents of a heterocyclic ring and further having at least one hydrophilic group, preferred is a pyrazole compound having one hydrophilic group (more preferably, an amino group) at the third or fourth position of a pyrazole ring, an imidazole compound having one hydrophilic group (more preferably, an amino group) at the second or fourth position of an imidazole ring, or a pyrimidine compound having one hydrophilic group (more preferably, an amino group) at the second or fourth position of a pyrimidine ring, and more preferred is 2-aminopyrimidine, adenine, 2-aminobenzimidazole, or 3-amino-5-methylpyrazole.

The C log P value of the anticorrosive is preferably not less than −3.0, more preferably not less than −2.0 and still more preferably not less than −1.5 because this leads to more excellent corrosion prevention performance. At the same time, the C log P value of the anticorrosive is preferably not more than 3.0, more preferably not more than 2.5 and still more preferably not more than 2.0 because with this, the anticorrosive itself hardly remains as a residue on a surface of a substrate, leading to more excellent cleaning performance of the cleaning liquid.

Examples of the anticorrosive with the Clog P value being within a range of −3.0 to 3.0 include trimellitic acid (1.00), 4-hydroxyphthalic acid (0.67), 4-aminophthalic acid (−0.08), 4-sulfophthalic acid (−0.09), 5-sulfosalicylic acid (−0.69), 2,5-dihydroxybenzoic acid (1.56), 5-aminosalicylic acid (0.46), 4-hydroxyisophthalic acid (2.09), 5-hydroxyanthranilic acid (0.33), 2,5-diaminobenzoic acid (−0.24), 5-sulfoanthranilic acid (0.16), 1,3-phenylenediamine-4-sulfonic acid (−0.85), amidol (−1.29), 3-amino-4-hydroxybenzoic acid (0.55), 3-amino-4-hydroxybenzenesulfonic acid (−2.95), benzotriazole (BTA) (1.34), 2-aminopyrimidine (−0.89), adenine (−2.12), pyrazole (0.32), 3-amino-5-methylpyrazole (0.17), 2-aminobenzimidazole (0.86), L-ascorbic acid (−2.41), and diethylhydroxylamine (DEHA) (−0.09). The values in parentheses following the respective compounds above represent the C log P values of the compounds.

The cleaning liquid may contain one anticorrosive alone or two or more anticorrosives in combination.

The anticorrosive content of the cleaning liquid is not particularly limited and is preferably not less than 0.005 mass %, more preferably not less than 0.01 mass % and even more preferably not less than 0.05 mass % based on the total mass of the cleaning liquid because this leads to more excellent corrosion prevention performance with respect to a metal substrate. The upper limit thereof is not particularly limited and is preferably not more than 20 mass %, more preferably not more than 10 mass %, and even more preferably not more than 5 mass % based on the total mass of the cleaning liquid because this leads to more excellent corrosion prevention performance.

Further, the anticorrosive content is preferably not less than 0.05 mass %, more preferably not less than 0.1 mass % and even more preferably not less than 0.5 mass % based on the total mass of components, excluding a solvent, in the cleaning liquid. The upper limit thereof is not particularly limited and is preferably not more than 50 mass %, more preferably not more than 30 mass % and even more preferably not more than 20 mass % based on the total mass of components, excluding a solvent, in the cleaning liquid.

The mass ratio of the chelating agent content to the anticorrosive content (chelating agent content/anticorrosive content) is not particularly limited and is preferably 0.001 to 50, more preferably 0.01 to 20, and even more preferably 0.05 to 10 because this leads to excellent repetition stability when the corrosion level is evaluated between different substrates.

The mass ratio of the component A (more preferably, the component A that is an amino alcohol) content to the anticorrosive content (component A content/anticorrosive content) is not particularly limited and is preferably 0.1 to 200, more preferably 1 to 100, and even more preferably 5 to 50 because this leads to excellent repetition stability when the corrosion level is evaluated between different substrates.

[Water]

The cleaning liquid preferably contains water as a solvent.

The type of water used in the cleaning liquid is not particularly limited as long as it has no bad influence on a semiconductor substrate, and distilled water, deionized water and pure water (ultrapure water) are usable. Pure water is preferred because it hardly contains impurities and its influence on a semiconductor substrate is smaller in a semiconductor substrate manufacturing process.

The water content of the cleaning liquid may be the balance other than the chelating agent, the component A, the anticorrosive, and optional components to be described later. The water content is, for instance, preferably not less than 1 mass %, more preferably not less than 30 mass %, even more preferably not less than 60 mass %, and particularly preferably not less than 85 mass % based on the total mass of the cleaning liquid. The upper limit thereof is not particularly limited and is preferably not more than 99 mass % and more preferably not more than 95 mass % based on the total mass of the cleaning liquid.

[Optional Component]

The cleaning liquid may contain other optional components in addition to the foregoing components. Optional components are described below.

<Surfactant>

The cleaning liquid may contain a surfactant.

The surfactant is not particularly limited as long as it is a compound having a hydrophilic group and a hydrophobic group (lipophilic group) in the molecule, and examples thereof include an anionic surfactant, a cationic surfactant, a nonionic surfactant, and an amphoteric surfactant. In the present specification, the surfactant does not include any of the chelating agent, the component A, and the anticorrosive described above.

It is preferable for the cleaning liquid to contain the surfactant because this leads to more excellent effectiveness of the invention.

In many cases, the surfactant has a hydrophobic group selected from an aliphatic hydrocarbon group, an aromatic hydrocarbon group, and a combination thereof. The hydrophobic group that the surfactant has is not particularly limited; when the hydrophobic group contains an aromatic hydrocarbon group, the number of carbon atoms is preferably 6 or more and more preferably 10 or more. When the hydrophobic group contains no aromatic hydrocarbon group and is constituted only of an aliphatic hydrocarbon group, the number of carbon atoms is preferably 9 or more, more preferably 13 or more, and even more preferably 16 or more. The upper limit of the number of carbon atoms of the hydrophobic group is not particularly limited and is preferably not more than 20 and more preferably not more than 18.

(Anionic Surfactant)

Examples of the anionic surfactant usable in the cleaning liquid include a phosphoric acid ester-based surfactant having a phosphoric acid ester group, a phosphonic acid-based surfactant having a phosphonic acid group, a sulfonic acid-based surfactant having a sulfo group, a carboxylic acid-based surfactant having a carboxyl group, and a sulfuric acid ester-based surfactant having a sulfuric acid ester group, with those groups each acting as a hydrophilic group (acid group).

—Phosphoric Acid Ester-Based Surfactant—

Examples of the phosphoric acid ester-based surfactant include phosphoric acid ester (alkyl ether phosphoric acid ester), polyoxyalkylene ether phosphoric acid ester, and salts thereof. While the phosphoric acid ester and the polyoxyalkylene ether phosphoric acid ester usually include both a monoester and a diester, a monoester or a diester may be used alone.

Examples of the salts of the phosphoric acid ester-based surfactant include a sodium salt, a potassium salt, an ammonium salt, and an organic amine salt.

A monovalent alkyl group that the phosphoric acid ester and the polyoxyalkylene ether phosphoric acid ester have is not particularly limited and is preferably an alkyl group having 2 to 24 carbon atoms, more preferably an alkyl group having 6 to 18 carbon atoms, and even more preferably an alkyl group having 12 to 18 carbon atoms.

A divalent alkylene group that the polyoxyalkylene ether phosphoric acid ester has is not particularly limited and is preferably an alkylene group having 2 to 6 carbon atoms and more preferably an ethylene group or a 1,2-propanediyl group. The number of repeats of an oxyalkylene group in the polyoxyalkylene ether phosphoric acid ester is preferably 1 to 12 and more preferably 1 to 6.

For the phosphoric acid ester-based surfactant, preferred is octyl phosphoric acid ester, lauryl phosphoric acid ester, tridecyl phosphoric acid ester, myristyl phosphoric acid ester, cetyl phosphoric acid ester, stearyl phosphoric acid ester, polyoxyethylene octyl ether phosphoric acid ester, polyoxyethylene lauryl ether phosphoric acid ester, or polyoxyethylene tridecyl ether phosphoric acid ester, more preferred is lauryl phosphoric acid ester, tridecyl phosphoric acid ester, myristyl phosphoric acid ester, cetyl phosphoric acid ester, or stearyl phosphoric acid ester, and even more preferred is lauryl phosphoric acid ester, cetyl phosphoric acid ester, or stearyl phosphoric acid ester.

For the phosphoric acid ester-based surfactant, the compounds described in paragraphs [0012] to [0019] of JP 2011-040502 A can also be applied, and the contents thereof are incorporated in the present specification.

—Phosphonic Acid-Based Surfactant—

Examples of the phosphonic acid-based surfactant include alkyl phosphonic acid and polyvinyl phosphonic acid as well as aminomethyl phosphonic acid described in JP 2012-057108 A and the like.

—Sulfonic Acid-Based Surfactant—

Examples of the sulfonic acid-based surfactant include alkyl sulfonic acid, alkylbenzene sulfonic acid, alkylnaphthalene sulfonic acid, alkyl diphenyl ether disulfonic acid, alkyl methyl taurine, sulfosuccinic acid diester, polyoxyalkylene alkyl ether sulfonic acid, and salts thereof.

A monovalent alkyl group that the sulfonic acid-based surfactant has is not particularly limited and is preferably an alkyl group having 2 to 24 carbon atoms and more preferably an alkyl group having 6 to 18 carbon atoms.

A divalent alkylene group that the polyoxyalkylene alkyl ether sulfonic acid has is not particularly limited and is preferably an ethylene group or a 1,2-propanediyl group. The number of repeats of an oxyalkylene group in the polyoxyalkylene alkyl ether sulfonic acid is preferably 1 to 12 and more preferably 1 to 6.

Specific examples of the sulfonic acid-based surfactant include hexanesulfonic acid, octanesulfonic acid, decanesulfonic acid, dodecanesulfonic acid, toluenesulfonic acid, cumenesulfonic acid, octylbenzenesulfonic acid, dodecylbenzenesulfonic acid (DBSA), dinitrobenzenesulfonic acid (DNBSA), and lauryl dodecylphenyl ether disulfonic acid (LDPEDSA).

—Carboxylic Acid-Based Surfactant—

Examples of the carboxylic acid-based surfactant include alkyl carboxylic acid, alkylbenzene carboxylic acid, and polyoxyalkylene alkyl ether carboxylic acid, and salts thereof.

A monovalent alkyl group that the carboxylic acid-based surfactant has is not particularly limited and is preferably an alkyl group having 7 to 25 carbon atoms and more preferably an alkyl group having 11 to 17 carbon atoms.

A divalent alkylene group that the polyoxyalkylene alkyl ether carboxylic acid has is not particularly limited and is preferably an ethylene group or a 1,2-propanediyl group. The number of repeats of an oxyalkylene group in the polyoxyalkylene alkyl ether carboxylic acid is preferably 1 to 12 and more preferably 1 to 6.

Specific examples of the carboxylic acid-based surfactant include lauric acid, myristic acid, palmitic acid, stearic acid, polyoxyethylene lauryl ether acetic acid, and polyoxyethylene tridecyl ether acetic acid.

—Sulfuric Acid Ester-Based Surfactant—

Examples of the sulfuric acid ester-based surfactant include sulfuric acid ester (alkyl ether sulfuric acid ester), polyoxyalkylene ether sulfuric acid ester, and salts thereof.

A monovalent alkyl group that the sulfuric acid ester and the polyoxyalkylene ether sulfuric acid ester have is not particularly limited and is preferably an alkyl group having 2 to 24 carbon atoms and more preferably an alkyl group having 6 to 18 carbon atoms.

A divalent alkylene group that the polyoxyalkylene ether sulfuric acid ester has is not particularly limited and is preferably an ethylene group or a 1,2-propanediyl group. The number of repeats of an oxyalkylene group in the polyoxyalkylene ether sulfuric acid ester is preferably 1 to 12 and more preferably 1 to 6.

Specific examples of the sulfuric acid ester-based surfactant include lauryl sulfuric acid ester, myristyl sulfuric acid ester, and polyoxyethylene lauryl ether sulfuric acid ester.

(Cationic Surfactant)

Examples of the cationic surfactant include modified aliphatic polyamine (e.g., polyethylene polyamine).

(Nonionic Surfactant)

Examples of the nonionic surfactant include polyoxyalkylene alkyl ether, polyoxyalkylene alkenyl ether, polyoxyethylene alkyl phenyl ether, polyoxyalkylene glycol, polyoxyalkylene monoalkylate (monoalkyl fatty acid ester polyoxyalkylene), polyoxyalkylene dialkylate (dialkyl fatty acid ester polyoxyalkylene), bispolyoxyalkylene alkylamide, sorbitan fatty acid ester, polyoxyethylene sorbitan fatty acid ester, polyoxyethylene alkylamine, glycerine fatty acid ester, oxyethylene-oxypropylene block copolymer, acetylene glycol-based surfactant, and acetylene-based polyoxyethylene oxide.

(Amphoteric Surfactant)

Examples of the amphoteric surfactant include carboxy betaine (e.g., alkyl-N,N-dimethylaminoacetic acid betaine, and alkyl-N,N-dihydroxyethylaminoacetic acid betaine), sulfo betaine (e.g., alkyl-N,N-dimethylsulfoethylene ammonium betaine), imidazolinium betaine (e.g., 2-alkyl-N-carboxymethyl-N-hydroxyethylimidazolinium betaine), and alkylamine oxide (e.g., N,N-dimethylalkylamine oxide).

For the surfactant, the compounds described in paragraphs [0092] to [0096] of JP 2015-158662 A, paragraphs [0045] to [0046] of JP 2012-151273 A, and paragraphs [0014] to [0020] of JP 2009-147389 A can also be applied, and the contents thereof are incorporated in the present specification.

The cleaning liquid preferably contains the anionic surfactant (more preferably, the phosphoric acid ester-based surfactant). The anionic surfactants may be used singly or in combination of two or more.

Those surfactants may be used singly or in combination of two or more.

When the cleaning liquid contains the surfactant, the surfactant content is preferably 0.05 to 10.0 mass % and more preferably 0.2 to 5.0 mass % based on the total mass of the cleaning liquid.

Further, when the cleaning liquid contains the surfactant, the content thereof is preferably 0.5 to 50 mass % and more preferably 1.0 to 20 mass % based on the total mass of components, excluding a solvent, in the cleaning liquid.

Commercial products may be used as those surfactants.

<Additives>

The cleaning liquid may optionally contain other additives than the foregoing components. Examples of such additives include a pH adjuster, a polymer, a fluorine compound, and an organic solvent.

(pH Adjuster)

The cleaning liquid may contain a pH adjuster for adjusting and maintaining the pH of the cleaning liquid. Examples of the pH adjuster include a basic compound and an acidic compound other than the foregoing components.

Examples of the basic compound include a basic organic compound and a basic inorganic compound.

The basic organic compound is a compound different from any of the component A, the hydroxylamine compound, and the quaternary ammonium compound described above.

Examples of the basic inorganic compound include an alkali metal hydroxide and an alkaline earth metal hydroxide. Ammonia is not included in the basic inorganic compound.

Examples of the alkali metal hydroxide include lithium hydroxide, sodium hydroxide, potassium hydroxide, and cesium hydroxide. Examples of the alkaline earth metal hydroxide include calcium hydroxide, strontium hydroxide, and barium hydroxide.

The cleaning liquid may contain, other than the foregoing compounds, at least one selected from the group consisting of nitro, nitroso, oxime, ketoxime, aldoxime, nitrone, lactam, isocyanide compounds, hydrazide compounds such as carbohydrazide, and urea, as the basic compound.

The component A, the hydroxylamine compound, and/or the quaternary ammonium compound contained in the cleaning liquid may also serve as the basic compound for reducing the pH of the cleaning liquid.

Those basic compounds for use may be commercial products or composites suitably synthesized by a known method.

Examples of the acidic compound include an inorganic acid and an organic acid.

Examples of the inorganic acid include hydrochloric acid, sulfuric acid, sulfurous acid, nitric acid, nitrous acid, phosphoric acid, boric acid, and hexafluorophosphoric acid. Salts of the inorganic acids may also be used, and examples thereof include ammonium salts of the inorganic acids, more specifically, ammonium chloride, ammonium sulfate, ammonium sulfite, ammonium nitrate, ammonium nitrite, ammonium phosphate, ammonium borate, and ammonium hexafluorophosphate.

For the inorganic acid, phosphoric acid or phosphate is preferred, and phosphoric acid is more preferred.

The organic acid is an organic compound having an acidic functional group and showing acidic properties (pH: less than 7.0) in an aqueous solution and is a compound that is not included in the chelating agent or the anionic surfactant described above. Examples of the organic acid include lower aliphatic monocarboxylic acids (with 1 to 4 carbon atoms) such as formic acid, acetic acid, propionic acid and butyric acid.

As the acidic compound, a salt of the acidic compound may be used as long as it forms an acid or an acid ion (anion) in an aqueous solution.

An acidic chelating agent and/or anionic surfactant contained in the cleaning liquid may also serve as the acidic compound for reducing the pH of the cleaning liquid.

As the acidic compound, a commercial product or a composite suitably synthesized by a known method may be used.

The pH adjusters may be used singly or in combination of two or more.

When the cleaning liquid contains the pH adjuster, the content thereof is selected depending on the types and amounts of other components and the pH of a target cleaning liquid, and is preferably 0.03 to 10 mass % and more preferably 0.1 to 5 mass % based on the total mass of the cleaning liquid.

Further, when the cleaning liquid contains the pH adjuster, the content thereof is selected depending on the types and amounts of other components and the pH of a target cleaning liquid, and is preferably 0.2 to 30 mass % and more preferably 0.5 to 10 mass % based on the total mass of components, excluding a solvent, in the cleaning liquid.

For the polymer, the water-soluble polymers described in paragraphs [0043] to [0047] of JP 2016-171294 A can be applied, and the contents thereof are incorporated in the present specification.

For the fluorine compound, the compounds described in paragraphs [0013] to [0015] of JP 2005-150236 A can be applied, and the contents thereof are incorporated in the present specification.

For the organic solvent, any of known organic solvents may be used, and hydrophilic organic solvents such as alcohols and ketones are preferred. The organic solvents may be used singly or in combination of two or more.

The amounts of the polymer, fluorine compound and organic solvent for use are not particularly limited and may be suitably specified in the ranges that do not impair the effectiveness of the invention.

The contents of the respective components above in the cleaning liquid can be measured by known methods such as gas chromatography-mass spectrometry (GC-MS), liquid chromatography-mass spectrometry (LC-MS), and ion-exchange chromatography (IC).

[Physical Properties of Cleaning Liquid]

<pH>

The pH of the cleaning liquid is more than 7.0 at 25° C. In other words, the cleaning liquid shows alkaline properties.

The pH of the cleaning liquid is preferably not less than 8.0, more preferably not less than 8.5, and even more preferably not less than 9.0 at 25° C. because this leads to more excellent corrosion prevention performance with respect to a metal film (particularly a Cu- or W-containing metal film). The upper limit of the pH of the cleaning liquid is not particularly limited and is preferably not more than 12.0 and more preferably not more than 11.5 at 25° C. because this leads to more excellent corrosion prevention performance with respect to a metal film (particularly a Co- or W-containing metal film).

The pH of the cleaning liquid may be adjusted by using the foregoing pH adjusters as well as components functioning as the pH adjuster, such as the component A, the hydroxylamine compound, the quaternary ammonium compound, the chelating agent, and the anionic surfactant.

The pH of the cleaning liquid can be measured with a known pH meter by the method according to JIS Z 8802-1984.

<Metal Content>

In the cleaning liquid, the content of each of metals (elemental metals of Fe, Co, Na, K, Cu, Mg, Mn, Li, Al, Cr, Ni, Zn, Sn and Ag) contained as impurities in the liquid (measured as the ion concentration) is preferably not more than 5 ppm by mass and more preferably not more than 1 ppm by mass. Since it is expected in manufacture of leading-edge semiconductor devices that a cleaning liquid with even higher purity should be required, the metal content is still more preferably less than 1 ppm by mass, that is, a value on the order of ppb by mass or less, and particularly preferably 100 ppb by mass or less. The lower limit thereof is not particularly limited and is preferably 0.

Exemplary methods of reducing the metal content include a refining treatment, such as distillation or filtration using ion-exchange resin or a filter, that is carried out in a stage of raw materials to be used in manufacture of the cleaning liquid or a stage after manufacture of the cleaning liquid.

Another method of reducing the metal content is the one using, as a container storing a raw material or the manufactured cleaning liquid, a container from which impurities are not largely leached, which will be described later. Still another method is providing lining of fluororesin on the portions of members that are to contact the relevant liquid, such as inner walls of pipes used in manufacture of the cleaning liquid, in order to prevent metal components from being leached from the members such as the pipes.

<Coarse Particles>

The cleaning liquid may contain coarse particles but preferably in a small amount. The coarse particles herein refer to particles with a diameter (particle size) of 0.4 μm or more when the particle shape is assumed to be a sphere.

For the coarse particle content of the cleaning liquid, the content of particles with a particle size of 0.4 μm or more is preferably not more than 1000 particles and more preferably not more than 500 particles per milliliter of the cleaning liquid. The lower limit thereof is not particularly limited and is for instance 0. The content of particles with a particle size of 0.4 μm or more measured by one of the foregoing measurement methods is even more preferably at or below the detection limit.

The coarse particles contained in the cleaning liquid are particles of dust, dirt, organic and inorganic solid matter, and the like contained as impurities in raw materials and particles of dust, dirt, organic and inorganic solid matter, and the like entering as contaminations during preparation of the cleaning liquid, which particles remain present as particles in the cleaning liquid at the end without being dissolved.

The content of the coarse particles present in the cleaning liquid can be measured in a liquid phase with a commercial measurement device for a light scattering liquid-borne particle counting method using a laser as a light source.

One exemplary method of removing the coarse particles is a refining treatment such as filtration to be described later.

The cleaning liquid may take the form of a kit including raw materials of the cleaning liquid that are separated into plural units.

One exemplary method of having the cleaning liquid in the form of a kit involves preparing a liquid composition containing the component A as a first liquid and preparing a liquid composition containing the other components as a second liquid.

[Manufacture of Cleaning Liquid]

The cleaning liquid can be manufactured by a known method. The method of manufacturing the cleaning liquid is described below in detail.

<Liquid Preparation Step>

The method of preparing the cleaning liquid is not particularly limited, and for instance, the cleaning liquid can be manufactured by mixing the foregoing components. The order and/or timing of incorporating the foregoing components are not particularly limited; for instance, the chelating agent, the component A, and the anticorrosive, as well as optional components such as the surfactant and the pH adjuster are sequentially added into a vessel containing purified pure water and then stirred, thereby preparing the cleaning liquid. When added to the vessel, water and those components may be added at one time or may be divided into plural portions and separately added.

A stirrer and a stirring method used in preparation of the cleaning liquid are not particularly limited, and a known device may be used as the stirrer or a disperser. Examples of the stirrer include an industrial mixer, a portable stirrer, a mechanical stirrer, and a magnetic stirrer. Examples of the disperser include an industrial disperser, a homogenizer, an ultrasonic disperser, and a bead mill.

Mixing of the components in the preparation step of the cleaning liquid, a refining treatment to be described later, and storage of the manufactured cleaning liquid are carried out at a temperature of preferably not higher than 40° C. and more preferably not higher than 30° C. At the same time, not lower than 5° C. is preferred, and not lower than 10° C. is more preferred. The preparation, the treatment and/or the storage of the cleaning liquid within the above temperature range makes it possible to maintain stable performance for a long period of time.

(Refining Treatment)

One or more of raw materials used in preparation of the cleaning liquid is preferably subjected to a refining treatment in advance. The refining treatment is not particularly limited, and examples thereof include known methods such as distillation, ion exchange, and filtration.

The degree of refining is not particularly limited, and a raw material is refined to a purity of preferably not less than 99 mass % and more preferably not less than 99.9 mass %.

Examples of specific methods of the refining treatment include a method in which a raw material is passed through ion-exchange resin, a reverse osmosis membrane (RO membrane) or the like, distillation of a raw material, and filtration to be described later.

As the refining treatment, the foregoing refining methods may be used in combination of two or more. For instance, a raw material may be firstly subjected to primary refinement in which the material is passed through a RO membrane and then to secondary refinement in which the material is passed through a refinement device made of cation exchange resin, anion exchange resin, or mixed-bed ion exchange resin.

The refining treatment may be carried out plural times.

(Filtration)

A filter used in filtration is not particularly limited as long as it is of a type that has been conventionally used for filtration. Examples of the filter include filters made of fluororesins such as polytetrafluoroethylene (PTFE) and tetrafluoroethylene-perfluoroalkylvinylether copolymer (PFA), polyamide resins such as nylon, and polyolefin resins (including high density ones and ultra high molecular weight ones) such as polyethylene and polypropylene (PP). Preferred is a filter made of, of the above materials, a material selected from the group consisting of polyethylene, polypropylene (including high density polypropylene), fluororesin (including PTFE and PFA), and polyamide resin (including nylon), and more preferred is a filter made of fluororesin. By filtering a raw material with the filter made of such a material, foreign matter with high polarity that easily causes defects can be effectively removed.

The filter has a critical surface tension of preferably 70 to 95 mN/m and more preferably 75 to 85 mN/m. It should be noted that the value of the critical surface tension of the filter is a nominal value provided by its manufacturer. The use of the filter having a critical surface tension within the above range makes it possible to effectively remove foreign matter with high polarity that easily causes defects.

The filter has a pore size of preferably 2 to 20 nm and more preferably 2 to 15 nm. The pore size within the above range makes it possible to reliably remove fine foreign matter such as impurities and agglomerates contained in a raw material, while preventing clogging in filtration. The pore size herein can be determined by reference to a nominal value of the relevant filter manufacturer.

Filtration may be carried out only one time or two or more times. When filtration is carried out two or more times, the filters used may be the same or different.

Filtration is carried out preferably at room temperature (25° C.) or lower, more preferably at 23° C. or lower, and even more preferably at 20° C. or lower, and at the same time, preferably at 0° C. or higher, more preferably at 5° C. or higher, and even more preferably at 10° C. or higher. Filtration at a temperature within the foregoing range makes it possible to reduce the amounts of particulate foreign matter and impurities dissolved in a raw material and effectively remove foreign matter and impurities.

(Container)

The cleaning liquid (including an embodiment of a kit or a diluted solution to be described later) can be put into a given container and stored, transported and used as long as problems such as corrosion do not occur.

For the container, preferred is a container which has high cleanliness in its interior and in which leaching of impurities from the inner wall of a storage portion of the container to the liquid is suppressed, for semiconductor applications. Examples of such a container include various containers commercially available as containers for semiconductor cleaning liquids, as exemplified by, but not limited to, the "Clean Bottle" series manufactured by Aicello Corporation and "Pure Bottle" manufactured by Kodama Plastics Co., Ltd.

For the container storing the cleaning liquid, preferred is a container whose portion to contact the liquid, such as the inner wall of its storage portion, is formed from fluororesin (perfluororesin) or metal having undergone a rust proof and metal leaching prevention treatment.

The inner wall of the container is preferably formed from one or more resins selected from the group consisting of polyethylene resin, polypropylene resin, and polyethylene-polypropylene resin, or another resin different therefrom, or a metal having undergone a rust proof and metal leaching prevention treatment such as stainless steel, Hastelloy, Inconel, or Monel.

For another resin above, fluororesin (perfluororesin) is preferred. When such a container with its inner wall being formed from fluororesin is used, defects such as leaching of oligomers of ethylene or propylene can be suppressed as compared to a container with its inner wall being formed from polyethylene resin, polypropylene resin, or polyethylene-polypropylene resin.

Specific examples of such a container with its inner wall being formed from fluororesin include FluoroPure PFA composite drums manufactured by Entegris, Inc. In addition, the containers described in page 4 of JP 3-502677 A, page 3 of the description of WO 2004/016526, and pages 9 and 16 of the description of WO 99/046309 may also be used.

In addition to the foregoing fluororesin, quartz and an electrolytically polished metal material (i.e., a metal material having undergone electrolytic polishing) may also be preferably used for the inner wall of the container.

For a metal material used in manufacture of the foregoing electrolytically polished metal material, preferred is a metal material containing at least one selected from the group consisting of chromium and nickel, with the total content of chromium and nickel being more than 25 mass % based on the total mass of the metal material. Examples of such a metal material include stainless steel and a nickel-chromium alloy.

The total content of chromium and nickel in the metal material is more preferably not less than 30 mass % based on the total mass of the metal material.

The upper limit of the total content of chromium and nickel in the metal material is not particularly limited and is preferably not more than 90 mass %.

The method of electrolytic polishing of the metal material is not particularly limited, and any known methods may be used. For instance, the methods described in paragraphs [0011] to [0014] of JP 2015-227501 A and paragraphs [0036] to [0042] of JP 2008-264929 A may be used.

Preferably, the inside of the container is washed before being filled with the cleaning liquid. For a liquid used for washing, the amount of metal impurities in the liquid is preferably reduced in advance. After being manufactured, the cleaning liquid may be bottled in such containers as gallon bottles or quart bottles, transported and stored.

In order to prevent components in the cleaning liquid from changing during storage, the inside of each container may be replaced with an inert gas (nitrogen, argon or the like) having a purity of not less than 99.99995 vol % in advance. In particular, a gas with a low moisture content is preferred. While the transportation and the storage may be carried out at normal temperature, the temperature may be controlled to fall within the range of −20° C. to 20° C. to prevent the change of properties.

(Cleanroom)

It is preferable to conduct all of manufacture of the cleaning liquid, opening and washing of the containers, handling of the cleaning liquid such as filling, process and treatment analyses, and measurements in a cleanroom. The cleanroom preferably satisfies 14644-1 cleanroom standards. The cleanroom satisfies preferably one of ISO (International Organization for Standardization) Class 1, ISO Class 2, ISO Class 3, and ISO Class 4, more preferably ISO Class 1 or ISO Class 2, and even more preferably ISO Class 1.

<Dilution Step>

The cleaning liquid as above is preferably subjected to a dilution step in which the cleaning liquid is diluted with a diluent such as water and then used in cleaning of semiconductor substrates.

The dilution ratio of the cleaning liquid in the dilution step may be adjusted as appropriate depending on the types and contents of its components and the type of semiconductor substrates to be cleaned, and the ratio of the diluted cleaning liquid to the cleaning liquid before dilution is preferably 10 to 10000 times, more preferably 20 to 3000 times, and even more preferably 50 to 1000 times in mass ratio.

The cleaning liquid is diluted preferably with water because this leads to more excellent defect suppression performance.

The change in pH from that before dilution to that after dilution (a difference between the pH of the cleaning liquid before dilution and the pH of the diluted cleaning liquid) is preferably not more than 1.0, more preferably not more than 0.8 and even more preferably not more than 0.5.

The pH of the diluted cleaning liquid is preferably more than 7.0, more preferably not less than 7.5 and even more preferably not less than 8.0 at 25° C. The upper limit of the pH of the diluted cleaning liquid is preferably not more than 13.0, more preferably not more than 12.5 and even more preferably not more than 12.0 at 25° C.

The chelating agent content of the diluted cleaning liquid is not particularly limited and is preferably not less than 0.0005 mass %, more preferably not less than 0.001 mass % and even more preferably not less than 0.002 mass % based on the total mass of the diluted cleaning liquid because this leads to more excellent abrasive particle removing performance. The upper limit thereof is not particularly limited and is preferably not more than 0.1 mass %, more preferably not more than 0.05 mass %, and even more preferably not more than 0.03 mass % based on the total mass of the diluted cleaning liquid because this leads to excellent corrosion prevention performance with respect to a metal substrate.

The component A content of the diluted cleaning liquid is not particularly limited and is preferably not less than 0.005 mass %, more preferably not less than 0.01 mass % and even more preferably not less than 0.02 mass % based on the total mass of the diluted cleaning liquid because this leads to more excellent abrasive particle removing performance. The upper limit thereof is not particularly limited and is preferably not more than 0.2 mass %, more preferably not more than 0.1 mass %, and even more preferably not more than 0.05 mass % based on the total mass of the diluted cleaning liquid because this leads to excellent corrosion prevention performance with respect to a metal substrate.

The anticorrosive content of the diluted cleaning liquid is not particularly limited and is preferably not less than 0.00005 mass %, more preferably not less than 0.0001 mass % and even more preferably not less than 0.0005 mass % based on the total mass of the diluted cleaning liquid because this leads to more excellent corrosion prevention performance with respect to a metal substrate. The upper limit thereof is not particularly limited and is preferably not more than 0.02 mass %, more preferably not more than 0.01 mass %, and even more preferably not more than 0.05 mass % based on the total mass of the diluted cleaning liquid because this leads to more excellent corrosion prevention performance.

When the diluted cleaning liquid contains the compound B, the compound B content is preferably 0.00001 to 0.1 mass %, more preferably 0.0001 to 0.05 mass % and even more preferably 0.0001 to 0.03 mass % based on the total mass of the diluted cleaning liquid because this leads to more excellent effectiveness of the invention.

When the diluted cleaning liquid contains the nitrogen-containing heteroaromatic compound, the content of the nitrogen-containing heteroaromatic compound in the cleaning liquid is not particularly limited and is preferably 0.0001 to 0.1 mass % and more preferably 0.0005 to 0.05 mass % based on the total mass of the diluted cleaning liquid.

When the diluted cleaning liquid contains the reducing agent, the reducing agent content is not particularly limited and is preferably 0.001 to 0.2 mass % and more preferably 0.002 to 0.05 mass % based on the total mass of the diluted cleaning liquid.

When the diluted cleaning liquid contains the quaternary ammonium compound, the content thereof is preferably 0.0005 to 0.15 mass % and more preferably 0.001 to 0.1 mass % based on the total mass of the diluted cleaning liquid.

The water content of the diluted cleaning liquid may be the balance other than the chelating agent, the component A, the anticorrosive, and optional components described above. The water content is, for instance, preferably not less than 99 mass %, more preferably not less than 99.3 mass %, even more preferably not less than 99.6 mass %, and particularly preferably not less than 99.85 mass % based on the total mass of the diluted cleaning liquid. The upper limit thereof is not particularly limited and is preferably not more than 99.99 mass % and more preferably not more than 99.95 mass % based on the total mass of the diluted cleaning liquid.

When the diluted cleaning liquid contains the surfactant, the surfactant content is preferably 0.0005 to 0.1 mass % and more preferably 0.002 to 0.05 mass % based on the total mass of the diluted cleaning liquid.

When the diluted cleaning liquid contains the pH adjuster, the content thereof is selected depending on the types and amounts of other components and the pH of a target diluted cleaning liquid, and is preferably 0.0003 to 0.1 mass % and more preferably 0.001 to 0.05 mass % based on the total mass of the diluted cleaning liquid.

A specific method of diluting the cleaning liquid in the dilution step is not particularly limited, and the dilution step may be carried out according to the liquid preparation step of the cleaning liquid described above. A stirrer and a stirring method used in the dilution step are also not particularly limited, and stirring may be carried out with a known stirrer whose examples are listed in the liquid preparation step of the cleaning liquid described above.

Water used in the dilution step is preferably subjected to a refining treatment in advance. Preferably, the diluted cleaning liquid obtained in the dilution step is also subjected to a refining treatment.

The refining treatment is not particularly limited, and examples thereof include an ionic component reduction treatment using ion-exchange resin, a RO membrane, or the like, and removal of foreign matter through filtration, which are described above as examples of the refining treatment for the cleaning liquid; preferably, one of these treatments is carried out.

[Cleaning Method]

The cleaning method of the present invention includes a cleaning step of cleaning a semiconductor substrate having undergone a chemical mechanical polishing (CMP) process. The cleaning liquid described above is used in cleaning of semiconductor substrates having undergone the CMP process.

[Cleaning Object]

A cleaning object in the cleaning method of the invention is a semiconductor substrate containing metal. In particular, a semiconductor substrate having metal-containing matter is preferable.

Note that the expression “on a semiconductor substrate” in this specification includes places on the top, bottom and lateral sides of the semiconductor substrate and in a groove of the semiconductor substrate. The metal-containing matter on a semiconductor substrate includes not only metal-containing matter present directly on a surface of the semiconductor substrate but also metal-containing matter present on or above the semiconductor substrate via another layer.

A metal contained in a semiconductor substrate is for instance at least one metal M selected from the group consisting of Cu (copper), Co (cobalt), W (tungsten), Ti (titanium), Ta (tantalum), Ru (ruthenium), Cr (chromium), Hf (hafnium), Os (osmium), Pt (platinum), Ni (nickel), Mn (manganese), Zr (zirconium), Mo (molybdenum), La (lanthanum), and Ir (iridium).

The metal-containing matter is not limited as long as it is a substance containing metal (metallic atom), and examples thereof include a simple substance of the metal M, an alloy containing the metal M, an oxide of the metal M, a nitride of the metal M, and an oxynitride of the metal M.

The metal-containing matter may be a mixture containing two or more of those compounds.

The oxide, the nitride and the oxynitride above may be a composite oxide, a composite nitride and a composite oxynitride each of which contains metal.

The metallic atom content of the metal-containing matter is preferably not less than 10 mass %, more preferably not less than 30 mass % and even more preferably not less than 50 mass % based on the total mass of the metal-containing matter. The upper limit thereof is 100 mass % because the metal-containing matter may be exactly the metal itself.

The semiconductor substrate preferably has the metal-containing matter containing the metal M, and more preferably has the metal-containing matter containing at least one metal selected from the group consisting of Cu, Co, W, Ti, Ta, and Ru.

The semiconductor substrate that is a cleaning object to be cleaned with the cleaning liquid is not particularly limited, and examples thereof include one having a metal wiring film, a barrier metal, and an insulating film on a surface of a wafer constituting the semiconductor substrate.

Specific examples of the wafer constituting the semiconductor substrate include wafers made of silicon-based materials such as a silicon (Si) wafer, a silicon carbide (SiC) wafer, and a silicon-containing resin wafer (glass epoxy wafer), a gallium phosphide (GaP) wafer, a gallium arsenide (GaAs) wafer, and an indium phosphide (InP) wafer.

Applicable examples of the silicon wafer include an n-type silicon wafer in which a silicon wafer is doped with a pentavalent atom (e.g., phosphorus (P), arsenic (As), and antimony (Sb)), and a p-type silicon wafer in which a silicon wafer is doped with a trivalent atom (e.g., boron (B), and gallium (Ga)). A silicon of the silicon wafer may be any of, for example, amorphous silicon, monocrystalline silicon, polycrystalline silicon, and polysilicon.

In particular, the cleaning liquid is useful for wafers made of silicon-based materials such as the silicon wafer, the silicon carbide wafer, and the silicon-containing resin wafer (glass epoxy wafer).

The semiconductor substrate may have an insulating film on the wafer described above.

Specific examples of the insulating film include silicon oxide films (e.g., a silicon dioxide ($SiO_2$) film and a tetraethyl orthosilicate ($Si(OC_2H_5)_4$) film (TEOS film)), silicon nitride films (e.g., a silicon nitride ($Si_3N_4$) film and a silicon nitride/carbide (SiNC) film), and low dielectric (Low-k) films (e.g., a carbon-doped silicon oxide (SiOC) film and a silicon carbide (SiC) film).

The semiconductor substrate may have a metal film. Examples of the metal film that the semiconductor substrate has include a metal film containing at least one metal selected from the group consisting of copper (Cu), cobalt (Co), and tungsten (W), as exemplified by a film primarily composed of copper (copper-containing film), a film primarily composed of cobalt (cobalt-containing film), a film primarily composed of tungsten (tungsten-containing film), and a metal film constituted of an alloy containing one or more selected from the group consisting of Cu, Co and W. The metal film as above is formed as a metal wiring film or a barrier metal on the wafer.

Preferably, the semiconductor substrate has a metal film containing at least one selected from the group consisting of copper and cobalt. It is also preferable for the semiconductor substrate to have a metal film containing tungsten.

Examples of the copper-containing film include a wiring film composed only of metallic copper (copper wiring film) and a wiring film made of an alloy composed of metallic copper and other metals (copper alloy wiring film).

Specific examples of the copper alloy wiring film include a wiring film made of an alloy composed of copper and one or more metals selected from aluminum (Al), titanium (Ti), chromium (Cr), manganese (Mn), tantalum (Ta) and tungsten (W). More specifically, examples thereof include a copper-aluminum alloy wiring film (CuAl alloy wiring film), a copper-titanium alloy wiring film (CuTi alloy wiring film), a copper-chromium alloy wiring film (CuCr alloy wiring film), a copper-manganese alloy wiring film (CuMn alloy wiring film), a copper-tantalum alloy wiring film (CuTa alloy wiring film), and a copper-tungsten alloy wiring film (CuW alloy wiring film).

Examples of the cobalt-containing film (a metal film primarily composed of cobalt) include a metal film composed only of metallic cobalt (cobalt metal film) and a metal film made of an alloy composed of metallic cobalt and other metals (cobalt alloy metal film).

Specific examples of the cobalt alloy metal film include a metal film made of an alloy composed of cobalt and one or more metals selected from titanium (Ti), chromium (Cr), iron (Fe), nickel (Ni), molybdenum (Mo), palladium (Pd), tantalum (Ta) and tungsten (W). More specifically, examples thereof include a cobalt-titanium alloy metal film (CoTi alloy metal film), a cobalt-chromium alloy metal film (CoCr alloy metal film), a cobalt-iron alloy metal film (CoFe alloy metal film), a cobalt-nickel alloy metal film (CoNi alloy metal film), a cobalt-molybdenum alloy metal film (CoMo alloy metal film), a cobalt-palladium alloy metal film (CoPd alloy metal film), a cobalt-tantalum alloy metal film (CoTa alloy metal film), and a cobalt-tungsten alloy metal film (CoW alloy metal film).

The cleaning liquid is useful for a substrate having the cobalt-containing film. Of the cobalt-containing films, the cobalt metal film is often used as a wiring film, and the cobalt alloy metal film is often used as a barrier metal.

In some cases, it is preferable to use the cleaning liquid in cleaning of the semiconductor substrate having at least the copper-containing wiring film and the metal film (cobalt barrier metal), which is composed only of metallic cobalt and is a barrier metal of the copper-containing wiring film, on or above the wafer constituting the substrate, with the copper-containing wiring film and the cobalt barrier metal being in contact with each other at a surface of the substrate.

Examples of the tungsten-containing film (a metal film primarily composed of tungsten) include a metal film composed only of metallic tungsten (tungsten metal film) and a metal film made of an alloy composed of tungsten and other metals (tungsten alloy metal film).

Specific examples of the tungsten alloy metal film include a tungsten-titanium alloy metal film (WTi alloy metal film) and a tungsten-cobalt alloy metal film (WCo alloy metal film).

The tungsten-containing film is often used as a barrier metal.

The methods of forming the foregoing insulating film, copper-containing wiring film, cobalt-containing film and tungsten-containing film on the wafer constituting the semiconductor substrate are not particularly limited as long as they are known methods used in this field.

One exemplary method of forming the insulating film is a method in which the wafer constituting the semiconductor substrate is subjected to a heating treatment in the presence of oxygen gas to form a silicon oxide film, whereafter silane and ammonia gases are introduced to form a silicon nitride film by a chemical vapor deposition (CVD) method.

Exemplary methods of forming the copper-containing wiring film, the cobalt-containing film and the tungsten-containing film include a method in which a circuit is formed on the above wafer having the insulating film by a known method using a resist for instance, whereafter the copper-containing wiring film, the cobalt-containing film and the tungsten-containing film are formed by plating, the CVD method, and other methods.

<CMP Process>

The CMP process is, for instance, a process for planarizing a surface of the substrate having the metal wiring film, the barrier metal and the insulating film through a combination of a chemical action induced by use of a polishing liquid (polishing slurry) containing abrasive particles (abrasive grains) and mechanical polishing. Abrasive particles (e.g., silica and alumina) used in the CMP process, metal impurities (metal residues) derived from the polished metal wiring film and barrier metal, and other impurities sometimes remain on the surface of the semiconductor substrate having undergone the CMP process.

These impurities may cause, for instance, a short-circuit between wirings and adversely affect electric characteristics of the semiconductor substrate; therefore, the semiconductor substrate having undergone the CMP process is subjected to a cleaning treatment to remove these impurities from the surface of the semiconductor substrate.

Specific examples of the semiconductor substrate having undergone the CMP process include, but not limited to, a substrate having undergone the CMP process described in Journal of the Japan Society for Precision Engineering, Vol. 84, No. 3, 2018.

The polishing liquid used in the CMP process is not particularly limited as long as it contains abrasive particles.

Examples of the abrasive particles include inorganic abrasive grains made of silica, alumina, zirconia, ceria, titania, germania, and silicon carbide, and organic abrasive grains made of polystyrene, acrylic polymer, and polyvinyl chloride.

Silica particles are not particularly limited, and examples thereof include precipitated silica, fumed silica, and colloidal silica, with colloidal silica being preferred. The colloidal silica may be a commercial product, as exemplified by PL-1, PL-3, PL-7, PL-10H, PL-1D, PL-07D, PL-2D, and PL-3D (all of which are product names, manufactured by Fuso Chemical Co., Ltd.).

Preferably, the polishing liquid is a slurry.

The abrasive particles have an average primary particle size of preferably not more than 60 nm and more preferably not more than 30 nm because with this, generation of defects can be further suppressed. The lower limit of the average primary particle size of the abrasive particles is preferably not less than 1 nm and more preferably not less than 3 nm because with this, agglomeration can be suppressed, resulting in improved temporal stability of the polishing liquid.

The average primary particle size is determined by measuring the particle sizes (equivalent circle diameters) of 1,000 primary particles arbitrarily selected from an image taken with a transmission electron microscope JEM 2010 (voltage applied: 200 kV) manufactured by JEOL Ltd., and obtaining the arithmetic mean of the measurements. The equivalent circle diameter refers to the diameter of a circle when the shape of a particle at observation is assumed to be a perfect circle having the same projected area as that of the particle.

However, when a commercial product is used for the abrasive particles, the value stated in the relevant catalog is preferentially employed as the average primary particle size of the abrasive particles.

The average secondary particle size of the abrasive particles is not particularly limited and is preferably not more than 500 nm and more preferably not more than 100 nm. The lower limit of the average secondary particle size of the abrasive particles is not particularly limited and is preferably not less than 3 nm and more preferably not less than 7 nm.

In this specification, the average secondary particle size corresponds to the average particle size (equivalent circle diameter) of secondary particles in an agglomerated state and can be determined by the same method as that for the average primary particle size described above.

However, when a commercial product is used for the abrasive particles, the value stated in the relevant catalog is preferentially employed as the average secondary particle size of the abrasive particles.

For the abrasive particles, use may be made of one type alone or two or more types in combination.

The upper limit of the abrasive particle content is preferably not more than 15.0 mass % and more preferably not more than 10.0 mass % based on the total mass of the polishing liquid. The lower limit thereof is preferably not less than 0.01 mass % and more preferably not less than 0.05 mass % based on the total mass of the polishing liquid.

The polishing liquid preferably contains water and a metal corrosion inhibitor and may contain at least one additive selected from the group consisting of hydrogen peroxide, an organic solvent, a passivation film forming agent, and a surfactant, in addition to the abrasive particles.

For the polishing liquid used in the CMP process, polishing liquids described in the description of WO 2018/159530 and the like can be applied, and the contents thereof are incorporated in the present specification.

[Parameter D.F]

The cleaning method of the invention satisfies Condition 1: a product of a contact angle ratio obtained by the test method 1 and a specific degree of agglomeration obtained by the test method 2 (parameter D.F) is not more than 15.

To check whether the cleaning method satisfies Condition 1 or not, the change in the contact angle of a surface of a metal film of an object substrate between the contact angle before cleaning and that after cleaning is measured by the test method 1 described below, and the change in the particle size of abrasive particles contained in a polishing liquid between the particle size before the operation in which the abrasive particles are agglomerated through addition of metal ions and separated using the cleaning liquid and the particle size after the operation is measured by the test method 2 described below.

<Test Method 1>

In the test method 1, first, an object substrate having on its surface a metal film made of metal contained in a semiconductor substrate is subjected to a pretreatment for the metal film using an acid. Subsequently, the static contact angle of the pretreated metal film with respect to water is measured by the sessile drop method to obtain a first contact angle (°). Separately, the object substrate having on its surface the metal film made of the metal contained in the semiconductor substrate is subjected to the pretreatment for the metal film using the acid, and the pretreated metal film is allowed to contact the cleaning liquid for 1 minute. Thereafter, a drying treatment is carried out to dry the surface of the metal film by spraying nitrogen gas thereto. The static contact angle of the metal film with respect to water is measured by the sessile drop method within 3 minutes after the surface of the metal film is dried through the drying treatment, thus obtaining a second contact angle (°). The ratio of the second contact angle to the first contact angle is calculated to obtain a contact angle ratio.

Each object substrate used in the test method 1 has on its surface a metal film constituted of a single metal alone. With the metal film on the surface, the ratio between the specific contact angles is measured.

Examples of the metal film include a metal film composed only of copper, a metal film composed only of cobalt, and a metal film composed only of tungsten, which are described above as the metal film that the semiconductor substrate has in the description of the cleaning object.

Before measuring the first and second contact angles of the metal films, the metal films are subjected to the pretreatment using an acid. The pretreatment removes a metal oxide film formed on the surface side of the metal film to expose a metal surface constituting the metal film. This is carried out for calculating the parameter D.F using proper measurements of the contact angles.

The acid used in the pretreatment is not particularly limited, and examples thereof include citric acid and hydrochloric acid.

Next, the contact angle of water with respect to the pretreated metal film is measured to thereby obtain the first contact angle (°). The method of measuring the contact angle is described later. It is preferable that the first contact angle be measured within 30 seconds after the pretreatment of the metal film of the object substrate because this can suppress a variation among measurements of the first contact angles.

Separately from the object substrate used in measurement of the first contact angle, the same object substrate is subjected to the pretreatment, and the pretreated object substrate is brought into contact with the cleaning liquid to clean the surface of the metal film with the cleaning liquid.

The cleaning method is not particularly limited; preferably, the object substrate is immersed in the cleaning liquid, and more preferably, the object substrate is immersed in the cleaning liquid for at least 30 seconds, because this can suppress a variation among measurements of the second contact angles. The temperature of the cleaning liquid is preferably 20° C. to 30° C. and more preferably room temperature (23° C.) because this can suppress a variation among measurements of the second contact angles.

The cleaning treatment above may be followed by a rinsing treatment for rinsing the surface of the metal film before the drying treatment. Water is preferred as a rinsing liquid used in the rinsing treatment.

Subsequently, the drying treatment is carried out for drying the surface of the metal film having been treated with the cleaning liquid, by spraying nitrogen gas to the surface.

It is preferable that the metal film be dried within 3 minutes (more preferably, 1 minute) after the treatment with the cleaning liquid or the treatment with the rinsing liquid because this can suppress a variation among measurements of the second contact angles. Note that in this specification, the metal film is regarded as being dry when the cleaning liquid or the rinsing liquid is not visually observable on the surface of the metal film.

Spraying nitrogen gas in the drying treatment may be carried out according to a method known as a drying method of a semiconductor substrate. One example of the drying treatment is feeding a nitrogen gas flow to the metal film of the object substrate using a known blower (drying device) to thereby remove the cleaning liquid and/or the rinsing liquid from the surface of the metal film.

The flow rate of nitrogen gas when sprayed is not particularly limited and is preferably 0.5 to 2 L/min. The drying treatment is carried out in an environment preferably at a temperature of 20° C. to 30° C. and more preferably at room temperature (23° C.). The drying treatment may be carried out under atmospheric pressure or reduced pressure.

The contact angle of water with respect to the surface of the metal film is measured within 3 minutes after the surface of the metal film is dried through the drying treatment, thus obtaining the second contact angle (°). Since the second contact angle is measured within 3 minutes after the drying treatment, a variation among measurements caused due to oxidation of the exposed metal surface can be suppressed.

The first and second contact angles of the metal films are measured by the sessile drop method.

Specifically, water is dropped on the surface of the metal film exposed through the pretreatment, an angle formed between the metal surface and water is measured on the side having water, and the measurement is used as a contact angle.

The method of determining a contact angle by the sessile drop method as above is described in, for instance, "Wettability and Control" (Technical Information Institute Co., Ltd.; published on Jan. 31, 2001).

The measurement of the contact angle of a droplet on the metal surface may be carried out using a known measurement device. One example of a contact angle measurement device is a fully automatic contact angle meter "DMo-901" (manufactured by Kyowa Interface Science Co., Ltd.).

The second contact angle measured by the test method 1 is not particularly limited as long as Condition 1 is satisfied, and is preferably not more than 40°, more preferably not more than 35°, and even more preferably not more than 30° because this leads to more excellent abrasive particle removing performance. In particular, when the metal film made of copper or cobalt is used, the second contact angle measured by the test method 1 is more preferably not more than 35° and even more preferably not more than 30° because this leads to even more excellent abrasive particle removing performance. When the metal film made of tungsten is used, the second contact angle measured by the test method 1 is more preferably not more than 30° and even more preferably not more than 25° because this leads to even more excellent abrasive particle removing performance.

The lower limit of the second contact angle is not particularly limited, and being not less than 5° is sufficient.

The contact angle ratio measured by the test method 1 is not particularly limited as long as Condition 1 is satisfied, and is preferably not more than 3.0 and more preferably not more than 2.0 because this leads to more excellent abrasive particle removing performance. When the metal film made of copper is used, the contact angle ratio measured by the test method 1 is even more preferably not more than 1.7. When the metal film made of tungsten is used, the contact angle ratio measured by the test method 1 is even more preferably not more than 1.8. When the metal film made of cobalt is used, the contact angle ratio measured by the test method 1 is even more preferably not more than 1.5.

The lower limit of the contact angle ratio is not particularly limited, and being not less than 0.15 is sufficient.

<Test Method 2>

The test method 2 is characterized in that: a series of processes are carried out in which abrasive particles are agglomerated by adding ions of a metal that forms a metal film to a polishing liquid used in the CMP process of a semiconductor substrate, whereafter the agglomerated abrasive particles are added to the cleaning liquid to loosen the agglomeration; and then the degree of agglomeration of the abrasive particles after the series of processes is calculated as the "specific degree of agglomeration."

The test method 2 uses the same metal as the metal used in the test method 1 and the cleaning liquid having the same composition as the cleaning liquid used in the test method 1.

In the test method 2, first, ions of the same metal as the metal constituting the metal film of the object substrate used in the test method 1 are added to the same polishing liquid as that used in the CMP process of a semiconductor substrate. The metal ions are added in the form of a metal salt with chloride ions such that the concentration of the metal ions is 0.03 mM (mmol/L) in the polishing liquid. Dissolution of the metal salt into the polishing liquid is confirmed, and the polishing liquid is allowed to stand for 30 seconds after the dissolution. Through this process, the abrasive particles contained in the polishing liquid are agglomerated. The term "agglomeration" in the test method 2 also includes the case where the abrasive particles are already agglomerated before the metal ions are added, and the degree of agglomeration of the abrasive particles increases due to the addition of the metal ions.

Next, the polishing liquid containing the agglomerated abrasive particles is added to the cleaning liquid separately prepared. At this time, the polishing liquid is added to the cleaning liquid such that the amount of the added polishing liquid is 1 mass % based on the total mass of the cleaning liquid. The cleaning liquid is stirred to disperse the abrasive particles in the cleaning liquid, whereafter the stirring is stopped and the cleaning liquid is allowed to stand for 30 seconds. Subsequently, the abrasive particles are taken out from the cleaning liquid, and the average secondary particle size of the abrasive particles taken out are measured.

The method of measuring the average secondary particle size of the abrasive particles may be one according to the method of measuring the average secondary particle size of the abrasive particles contained in the polishing liquid described above using a known measurement device. One example of the measurement device for the average secondary particle size of the abrasive particles is a transmission electron microscope "JEM 2010" (manufactured by JEOL Ltd.). Alternatively, the average secondary particle size of the abrasive particles may be measured with a known particle size distribution analyzer (e.g., "FPAR-1000" manufactured by Otsuka Electronics Co., Ltd.).

Next, the ratio of the measured average secondary particle size of the abrasive particles to the average secondary particle size of the abrasive particles before the metal salt is added is calculated to thereby obtain the specific degree of agglomeration. At this time, the average secondary particle size of the abrasive particles before the metal salt is added may be checked by reference to the value stated in the relevant catalog when the polishing liquid or the abrasive particles are a commercial product or may alternatively be measured according to the above-described method.

The specific degree of agglomeration measured by the test method 2 is not particularly limited as long as Condition 1 is satisfied, and is preferably not more than 10 and more preferably not more than 7 because this leads to even more excellent abrasive particle removing performance. The reason why the abrasive particle removing performance improves when the specific degree of agglomeration is within the foregoing range is probably as follows: The agglomeration of the abrasive particles is loosened better owing to the cleaning liquid, resulting in a decrease in the number of particles that have been coarsened due to adsorption of the abrasive particles to a passivation film forming agent and the metal ions contained in the polishing liquid and tend to remain on the substrate. When the metal film made of copper is used, the specific degree of agglomeration measured by the test method 2 is more preferably not more than 10 and even more preferably not more than 5 because this leads to even more excellent abrasive particle removing performance. When the metal film made of cobalt or tungsten is used, the specific degree of agglomeration measured by the test method 2 is more preferably not more than 5 and even more preferably not more than 3 because this leads to even more excellent abrasive particle removing performance.

The lower limit of the specific degree of agglomeration is not particularly limited, and being not less than 1 is sufficient.

The average secondary particle size of the abrasive particles measured after the series of processes in the test method 2 is not particularly limited as long as Condition 1 is satisfied, and is preferably not more than 300 nm and more preferably not more than 100 nm because this leads to even more excellent abrasive particle removing performance similarly to the above. When the metal film made of copper is used, the average secondary particle size of the abrasive particles after the series of processes is more preferably not more than 200 nm and even more preferably not more than 100 nm because this leads to even more excellent abrasive particle removing performance. When the metal film made of cobalt or tungsten is used, the average secondary particle size of the abrasive particles after the series of processes is more preferably not more than 300 nm and even more preferably not more than 100 nm because this leads to even more excellent abrasive particle removing performance.

The lower limit of the average secondary particle size of the abrasive particles after the series of processes is not particularly limited, and being not less than 20 nm is sufficient.

The contact angle ratio obtained by the test method 1 above and the specific degree of agglomeration obtained by the test method 2 above are multiplied to obtain their product as the parameter D.F. When the obtained parameter D.F is not more than 15, Condition 1 is satisfied.

When the cleaning method satisfies Condition 1, it is possible to suppress adhesion of abrasive particles generated through the CMP process to the surface of the metal film of the semiconductor substrate, thus improving performance of removing the abrasive particles remaining on the surface of the metal film. The reason of this is probably as follows. In the case of the cleaning method that satisfies Condition 1, it is presumed that: the surface of the metal film is hydrophilic to the extent that Condition 1 is satisfied, and this makes it difficult for agglomerated abrasive particles to adhere to the metal film in light of surface potential; the agglomeration of agglomerated abrasive particles generated through the CMP process is loosened owing to the cleaning liquid to the extent that Condition 1 is satisfied, resulting in reduced particle size of the abrasive particles; and the hydrophilicity of the abrasive particles increases owing to components contained in the cleaning liquid whereby the dispersibility of the abrasive particles in the cleaning liquid improves, thus making it difficult for the abrasive particles to adhere to the metal film.

As described above, the test methods 1 and 2 use the same metal and the cleaning liquid having the same composition.

For example, when the test method 1 uses an object substrate having on its surface a metal film made of copper, a metal salt used in the test method 2 is copper(II) chloride, and metal ions are $Cu^{2+}$ ions. Similarly, when the test method 1 uses an object substrate having on its surface a metal film made of cobalt, a metal salt used in the test method 2 is cobalt(II) chloride, and metal ions are $Co^{2+}$ ions. When the test method 1 uses an object substrate having on its surface a metal film made of tungsten, a metal salt used in the test method 2 is ammonium(II) tungstate, and metal ions are $WO_4^{2-}$ ions.

The parameter D.F is not particularly limited as long as Condition 1 is satisfied, and the parameter D.F is preferably not more than 12 when the metal film made of copper is used, is preferably not more than 12 and more preferably not more than 10 when the metal film made of tungsten is used, and is preferably not more than 12 when the metal film made of cobalt is used, because this leads to even more excellent abrasive particle removing performance.

The lower limit of the parameter D.F is not particularly limited, and being not less than 0.3 is sufficient.

[Method of Cleaning Semiconductor Substrates]

The method of cleaning semiconductor substrates is not particularly limited as long as it includes a cleaning step of cleaning the semiconductor substrate having undergone the CMP process by use of the foregoing cleaning liquid. It is preferable that the method of cleaning semiconductor substrates include a cleaning step in which the diluted cleaning liquid obtained in the foregoing dilution step is applied to the semiconductor substrate having undergone the CMP process to thereby clean the semiconductor substrate.

The cleaning step of cleaning the semiconductor substrate with the cleaning liquid is not particularly limited as long as it is a known method used for semiconductor substrates having undergone the CMP process, and any of known methods used in this field may be suitably employed, as exemplified by brush scrubbing cleaning that, while supplying the cleaning liquid to the semiconductor substrate, brings a cleaning member such as a brush into physical contact with a surface of the semiconductor substrate to remove residues and the like, an immersion method in which the semiconductor substrate is immersed in the cleaning liquid, a spinning (dropping) method in which the cleaning liquid is dropped while the semiconductor substrate is rotated, or a spraying method in which the cleaning liquid is sprayed. In cleaning by the immersion method, the cleaning liquid having the semiconductor substrate immersed therein is preferably subjected to an ultrasonic treatment because this can further reduce impurities remaining on the surface of the semiconductor substrate.

The cleaning step may be carried out only one time or two or more times. When the cleaning step is carried out two or more times, the same method may be repeated or different methods may be combined.

For the method of cleaning semiconductor substrates, any of a single wafer process and a batch process may be employed. The single wafer process is a method in which semiconductor substrates are treated one by one, while the batch process is a method in which a plurality of semiconductor substrates are treated at one time.

The temperature of the cleaning liquid used in cleaning of the semiconductor substrate is not particularly limited as long as it is the temperature employed in this field. While cleaning is typically carried out at room temperature (25° C.), the temperature can be arbitrarily selected in view of improvement in cleaning properties and/or suppression of damage to a member. The temperature of the cleaning liquid is preferably 10° C. to 60° C. and more preferably 15° C. to 50° C.

The cleaning time in cleaning of the semiconductor substrate depends on the types and contents of components contained in the cleaning liquid and therefore cannot be unconditionally stated; practically, the cleaning time is preferably 10 seconds to 2 minutes, more preferably 20 seconds to 1 minute and 30 seconds, and even more preferably 30 seconds to 1 minute.

The amount of supply (feed rate) of the cleaning liquid in the cleaning step of the semiconductor substrate is not particularly limited and is preferably 50 to 5000 mL/min and more preferably 500 to 2000 mL/min.

In cleaning of the semiconductor substrate, a mechanical stirring method may be used to further enhance the cleaning ability of the cleaning liquid.

Examples of the mechanical stirring method include a method involving circulating the cleaning liquid on the semiconductor substrate, a method involving flowing or spraying the cleaning liquid on the semiconductor substrate, and a method involving stirring the cleaning liquid by ultrasonics or megasonics.

The cleaning of the semiconductor substrate may be followed by a step of rinsing and washing the semiconductor substrate with a solvent (hereinafter called “rinsing step”).

The rinsing step is preferably a step that consecutively follows the cleaning step of the semiconductor substrate and that is carried out with a rinsing solvent (rinsing liquid) for 5 seconds to 5 minutes. The rinsing step may be carried out using the mechanical stirring method as above.

Examples of the rinsing solvent include water (preferably deionized (DI) water), methanol, ethanol, isopropyl alcohol, N-methylpyrrolidinone, γ-butyrolactone, dimethyl sulfoxide, ethyl lactate, and propylene glycol monomethyl ether acetate. Alternatively, an aqueous rinsing liquid with a pH of more than 8 (e.g., a diluted aqueous ammonium hydroxide) may be used.

The forgoing method of bringing the cleaning liquid into contact with the semiconductor substrate is applicable as a method of bringing the rinsing solvent into contact with the semiconductor substrate in the same manner.

The rinsing step may be followed by a drying step for drying the semiconductor substrate.

The drying method is not particularly limited, and examples thereof include spin drying, a method involving flowing dry gas on the semiconductor substrate, a method involving heating the substrate by a heating means such as a hot plate or an infrared lamp, Marangoni drying, Rotagoni drying, isopropyl alcohol (IPA) drying, and any combinations thereof.

<Buffing Treatment>

A surface of the semiconductor substrate that is a cleaning object may be subjected to a buffing treatment after the CMP process and before the cleaning step.

The buffing treatment is a treatment for reducing impurities on a surface of the semiconductor substrate by means of a polishing pad. Specifically, a surface of the semiconductor substrate having undergone the CMP process and the polishing pad are brought into contact with each other, and the semiconductor substrate and the polishing pad are moved to slide relatively to each other while a buffing composition is supplied to the contact portion therebetween. As a consequence, impurities on the surface of the semiconductor substrate are removed due to a frictional force caused by the polishing pad and a chemical action caused by the buffing composition.

For the buffing composition, a known buffing composition may be suitably used in accordance with the type of the semiconductor substrate and the types and amounts of impurities to be removed. Components contained in the buffing composition are not particularly limited, and examples thereof include a water-soluble polymer such as a polyvinyl alcohol, water serving as a dispersion medium, and an acid such as nitric acid.

One preferable embodiment of the buffing treatment is subjecting the semiconductor substrate to the buffing treatment using the foregoing cleaning liquid as the buffing composition.

A polishing device and polishing conditions used in the buffing treatment are suitably selected from known devices and conditions in accordance with the type of the semiconductor substrate and substances to be removed. For the buffing treatment, for example, the treatment described in paragraphs [0085] to [0088] of WO 2017/169539 can be applied, and the contents thereof are incorporated in the present specification.

EXAMPLES

The present invention is described below in further detail based on examples. The materials, amounts of use, ratios, and other factors stated in examples below may be suitably modified as long as they do not depart from the scope and spirit of the present invention. Therefore, the scope of the present invention should not be construed as being limited to the examples below.

In the examples below, the pH values of cleaning liquids were measured at 25° C. with a pH meter (type: F-74, manufactured by HORIBA, Ltd.) according to JIS Z 8802-1984.

In manufacture of cleaning liquids of Examples and Comparative Examples, handling of containers and preparation, filling, storage, analysis and measurement of the cleaning liquids were all conducted in a cleanroom with the level satisfying ISO Class 2 or lower class. In measurement of the metal content of a cleaning liquid, when the content of a substance at or below the detection limit of ordinary measurement was measured, the measurement was carried out after the cleaning liquid was concentrated to 1/100 in terms of volume, and the measurement result was converted into a value of the metal content of the liquid at the concentration before the liquid was concentrated, in order to improve the measurement accuracy.

[Raw Materials of Cleaning Liquid]

The following compounds were used to manufacture the cleaning liquids. The components used in Examples were those classified into a semiconductor grade or a high purity grade equivalent thereto.

[Chelating Agent]

The following compounds were used as the chelating agent in manufacture of cleaning liquids.

1-Hydroxyethylidene-1,1-diphosphonic acid (HEDPO): "Dequest 2000" manufactured by Thermphos Diethylenetriaminepentaacetic acid (DTPA): manufactured by FUJIFILM Wako Pure Chemical Corporation Glycine: manufactured by FUJIFILM Wako Pure Chemical Corporation 1,4-Diaminobutane: manufactured by FUJIFILM Wako Pure Chemical Corporation Chlorhexidine gluconate (CHG): manufactured by FUJIFILM Wako Pure Chemical Corporation Gluconic acid: manufactured by FUJIFILM Wako Pure Chemical Corporation Citric acid: manufactured by Fuso Chemical Co., Ltd.

[Component A (Amine Compound)]

The following compounds were used as the component A or the amine compound not included in the component A in manufacture of cleaning liquids.

2-Amino-2-methyl-1-propanol (AMP): manufactured by FUJIFILM Wako Pure Chemical Corporation (pKa1: 9.7, corresponding to the component A)

Monoethanolamine (MEA): manufactured by FUJIFILM Wako Pure Chemical Corporation (pKa1: 9.5, corresponding to the component A)

Triethanolamine (TEA): manufactured by FUJIFILM Wako Pure Chemical Corporation (pKa1: 7.8)

[Anticorrosive]

The following compounds were used as the anticorrosive in manufacture of cleaning liquids. Those anticorrosives shown below are all commercial products manufactured by FUJIFILM Wako Pure Chemical Corporation.

<Compound B>

Trimellitic acid (C log P value: 1.00)

4-Hydroxyphthalic acid (C log P value: 0.67)

4-Aminophthalic acid (C log P value: −0.08)

4-Sulfophthalic acid (C log P value: −0.09)

5-Sulfosalicylic acid (C log P value: −0.69)

2,5-Dihydroxybenzoic acid (C log P value: 1.56)

5-Aminosalicylic acid (C log P value: 0.46)

4-Hydroxyisophthalic acid (C log P value: 2.09)

5-Hydroxyanthranilic acid (C log P value: 0.33)

2,5-Diaminobenzoic acid (C log P value: −0.24)

5-Sulfoanthranilic acid (C log P value: 0.16)

1,3-Phenylenediamine-4-sulfonic acid (C log P value: −0.85)

Amidol (C log P value: −1.29)

3-Amino-4-hydroxybenzoic acid (C log P value: 0.55)

3-Amino-4-hydroxybenzenesulfonic acid (C log P value: −2.95)

Benzotriazole (BTA) (C log P value: 1.34)

<Nitrogen-Containing Heteroaromatic Compound>

2-Aminopyrimidine (C log P value: −0.89)

Adenine (C log P value: −2.12)

Pyrazole (C log P value: 0.32)

3-Amino-5-methylpyrazole (C log P value: 0.17)

2-Aminobenzimidazole (C log P value: 0.86)

<Reducing Agent>

L-Ascorbic acid (C log P value: −2.41)

Diethylhydroxylamine (DEHA) (C log P value: −0.09)

[Surfactant]

The following compounds were used as the surfactant in manufacture of cleaning liquids.

Lauryl phosphoric acid ester: "Phosten HLP," manufactured by Nikko Chemicals Co., Ltd.

Trimethyldecylammonium hydroxide (TMDH): manufactured by FUJIFILM Wako Pure Chemical Corporation In addition, one of potassium hydroxide (KOH) and sulfuric acid ($H_2SO_4$) as the pH adjuster as well as commercial ultrapure water (manufactured by FUJIFILM Wako Pure Chemical Corporation) was used in a manufacture step of the cleaning liquids in Examples.

[Manufacture of Cleaning Liquid]

Next, a method of manufacturing a cleaning liquid is described taking Example 1 as an example.

To ultrapure water, HEDPO (1-hydroxyethylidene-1,1-diphosphonic acid), AMP (2-amino-2-methyl-1-propanol), trimellitic acid, and Phosten HLP were added in amounts corresponding to the contents shown in Table 1, and subsequently the pH adjuster was added such that the pH of a cleaning liquid to be prepared was to be 10.5. The resulting mixture was sufficiently stirred with a stirrer, thereby obtaining a cleaning liquid of Example 1.

Cleaning liquids of Examples 2 to 36 and Comparative Examples 1 to 4 with the compositions shown in Tables 1 and 2 were manufactured according to the manufacturing method of Example 1.

In each of the manufactured cleaning liquids of Examples and Comparative Examples, the pH adjuster content was not more than 3 mass % based on the total mass of the relevant cleaning liquid, and the water content was 85 to 98 mass % based on the total mass of the relevant cleaning liquid.

In Tables, the "Amount (%)" columns provide the contents (unit: mass %) of the respective components based on the total mass of the relevant cleaning liquid. The symbol "*1" in the "pH adjuster" column represents that one of $H_2SO_4$ and KOH was added in such an amount as to allow the pH of the resulting cleaning liquid to be that as shown in the "pH" column.

The values in the "Ratio 1" column each represent the mass ratio of the chelating agent content to the anticorrosive content (chelating agent content/anticorrosive content).

The values in the "Ratio 2" column each represent the mass ratio of the amine compound (component A) content to the anticorrosive content (amine compound content/anticorrosive content).

The values in the "pH" column each represent the pH of the relevant cleaning liquid at 25° C. measured with the above pH meter.

[Measurement of Parameter D.F]

The parameter D.Fs were obtained using the cleaning liquids of Examples and Comparative Examples. More specifically, the product of a contact angle ratio obtained in Test 1 below and a specific degree of agglomeration obtained in Test 2 below was obtained and defined as the parameter D.F.

<Test 1: Measurement of Contact Angle Ratio>

One milliliter of the cleaning liquid of each of Examples and Comparative Examples was taken and diluted 100 times by volume with ultrapure water to prepare a sample of a diluted cleaning liquid.

An object substrate (a coupon substrate obtained by cutting an 8-inch diameter substrate into a 2-cm square piece) having on its surface a metal film made of copper was prepared. A pretreatment was carried out in which the object substrate was immersed in an aqueous citric acid solution to remove a metal oxide film formed on the surface of the metal film.

The contact angle (static contact angle; unit: °) of the surface of the metal film of the pretreated object substrate was measured by the sessile drop method using a fully automatic contact angle meter "DMo-901" (manufactured by Kyowa Interface Science Co., Ltd.), thus obtaining a first contact angle.

An object substrate prepared separately from the object substrate used in the measurement of the first contact angle was subjected to the pretreatment in the same manner as above. The pretreated object substrate was immersed for 1 minute in the sample of the diluted cleaning liquid with its temperature adjusted to room temperature (23° C.), whereafter the surface of the metal film was washed with running water at a flow rate of 1 L/min for 20 minutes. Subsequently, a drying treatment involving spraying nitrogen gas onto the surface of the metal film (flow rate: 1.5 L/min) using a nitrogen blow gun was carried out for 10 seconds to completely remove the cleaning liquid and water from the surface of the metal film.

The contact angle (static contact angle; unit: °) of the washed surface of the metal film was measured by the sessile drop method using the fully automatic contact angle meter "DMo-901" (manufactured by Kyowa Interface Science Co., Ltd.) 1 minute after the drying treatment was finished, thus obtaining a second contact angle.

The ratio of the second contact angle to the first contact angle was calculated to obtain a contact angle ratio.

Also for a metal film made of tungsten and a metal film made of cobalt, the first contact angles, the second contact angles, and the contact angle ratios were measured in the same manner as above.

The first contact angles measured in the above-described manner with respect to the metal film made of copper, the metal film made of tungsten, and the metal film made of cobalt were 25°, 20°, and 30°, respectively.

<Test 2: Measurement of Specific Degree of Agglomeration>

One milliliter of the cleaning liquid of each of Examples and Comparative Examples was taken and diluted 100 times by volume with ultrapure water to prepare a sample of a diluted cleaning liquid.

As a polishing liquid, prepared was a slurry A containing 3 mass % of colloidal silica ("PL-3"; average secondary particle size: 75 nm), 0.5 mass % of citric acid, 0.1 mass % of malic acid, 0.02 mass % of BTA, and 0.02 mass % of 1,2,4-triazole and with the pH adjusted to 10.5 using KOH. The obtained slurry A was put into a container, and copper chloride was further added thereto. At this time, the copper chloride was added in such an amount that the concentration of $Cu^{2+}$ ions was 0.03 mM (mmol/L) in the polishing liquid. It was visually confirmed that the copper chloride had been dissolved in the polishing liquid, and then the polishing liquid was allowed to stand for 30 seconds.

The resulting polishing liquid was added to the sample of the diluted cleaning liquid prepared above in another container. The amount of the polishing liquid added at this time was 1 mass % based on the total mass of the sample. The cleaning liquid to which the polishing liquid had been added was stirred to disperse abrasive particles in the cleaning liquid, then the stirring was stopped, and the cleaning liquid was allowed to stand for 30 seconds. Thereafter, the abrasive particles dispersed in the cleaning liquid were taken out.

The average secondary particle size of the abrasive particles taken out was measured in the following manner. For 100 abrasive particles arbitrarily selected from an image taken with a transmission electron microscope "JEM 2010" (voltage applied: 200 kV) manufactured by JEOL Ltd., the particle sizes (equivalent circle diameters) of the secondary particles in an agglomerated state were measured, and the arithmetic mean of the measurements was obtained, thus determining the average secondary particle size of the abrasive particles.

The ratio of the measured average secondary particle size of the abrasive particles to the average secondary particle size of the abrasive particles contained in the polishing liquid before the copper chloride was added was calculated to thereby obtain a specific degree of agglomeration.

Also for a metal film made of tungsten and a metal film made of cobalt, the specific degrees of agglomeration were calculated in the same manner as Test 2 above.

In the case of a metal film made of tungsten, W-2000 (commercial name; manufactured by Cabot Corporation; average secondary particle size of abrasive particles: 75 nm) was used as the polishing liquid, and addition of tungsten ions to the polishing liquid was carried out using ammonium tungstate.

In the case of a metal film made of cobalt, used as the polishing liquid was a slurry B containing 4 mass % of colloidal silica ("PL1"; average secondary particle size: 10 nm), 0.2 mass % of oxalic acid, 0.5 mass % of histidine, 0.03 mass % of BTA, and 0.03 mass % of alkyl phosphoric acid ester (C18) and with the pH adjusted to 9.5 using KOH.

The contact angle ratio obtained in Test 1 above and the specific degree of agglomeration obtained in Test 2 above were multiplied to obtain the parameter D.F.

For the cleaning liquids of Examples and Comparative Examples, Tables 1 and 2 show the second contact angles (°) and the contact angle ratios obtained in Test 1 above, the average secondary particle sizes of the abrasive particles taken out from the cleaning liquids ("Particle size" column) as measured in Test 2 above, the specific degrees of agglomeration measured in Test 2 above, and the parameter D.Fs each calculated as a product of the contact angle ratio and the specific degree of agglomeration.

[Measurement of Metal Content]

The metal contents of the cleaning liquids manufactured in Examples and Comparative Examples were measured.

The metal contents were measured with Agilent 8800 triple quadrupole ICP-MS (for semiconductor analysis, option #200) under the following measurement conditions.

(Measurement Conditions)

For a sample introduction system, a quartz torch, a coaxial type PFA nebulizer (for self-suction), and a platinum interface cone were used. Measurement parameters for the cool plasma condition were as follows.

Radio frequency (RF) output (W): 600

Flow rate of carrier gas (L/min): 0.7

Flow rate of make-up gas (L/min): 1

Sampling depth (mm): 18

In measurement of the metal content, metal particles and metal ions were not distinguished from each other, and the total content thereof was obtained. When two or more metals were detected, the total content of the two or more metals was obtained.

The measurement results of the metal contents are shown in the "Metal content (ppb)" column of Tables 1 and 2 (unit: ppb by mass). In Tables 1 and 2, the notation "<10" represents the metal content of the relevant cleaning liquid being less than 10 ppb by mass based on the total mass of the cleaning liquid.

[Evaluation of Cleaning Performance]

The evaluation was made on performance of removing abrasive particles on a surface of a metal film when the metal film having undergone chemical mechanical polishing by use of each of the cleaning liquids manufactured by the foregoing method was cleaned.

One milliliter of the cleaning liquid of each of Examples and Comparative Examples was taken and diluted 100 times by volume with ultrapure water to prepare a sample of a diluted cleaning liquid.

A wafer (diameter: 8 inches) having on its surface a metal film made of copper, tungsten or cobalt was polished with FREX 300S-II (a polishing apparatus, manufactured by Ebara Corporation). For a wafer having on its surface a metal film made of copper, the slurry A was used as the polishing liquid in polishing, thereby suppressing a variation in evaluation of cleaning performance caused due to the polishing liquid. Similarly, for a wafer having on its surface a metal film made of cobalt, the slurry B was used as the polishing liquid in polishing, and for a wafer having on its surface a metal film made of tungsten, W-2000 (commercial name; manufactured by Cabot Corporation) was used in polishing. The polishing pressure was 2.0 psi, and the feed rate of the polishing liquid was 0.28 mL/(min·$cm^2$). The polishing time was 60 seconds.

Thereafter, the polished wafer was cleaned for 1 minute using the sample of each diluted cleaning liquid whose temperature was adjusted to room temperature (23° C.), followed by drying.

The defects at a polished surface of the cleaned wafer were evaluated using a defect detection apparatus (ComPlus II, manufactured by Applied Materials, Inc.). Subsequently, the polished surface was observed with a scanning electron microscope (SEM), and the number of abrasive particles remaining on the polished surface was detected from an SEM observation image obtained, whereby the abrasive particle removing performance of the cleaning liquid was evaluated based on the evaluation criteria shown below.

The evaluation results of the abrasive particle removing performance are shown in Tables 1 and 2. As the number of abrasive particles detected at a polished surface of a wafer is smaller, the abrasive particle removing performance can be evaluated to be more excellent.

"A": The number of remaining abrasive particles being less than 30 per wafer

"B": The number of remaining abrasive particles being not less than 30 and less than 50 per wafer "C": The number of remaining abrasive particles being not less than 50 and less than 100 per wafer "D": The number of remaining abrasive particles being not less than 100 per wafer

[Evaluation of Corrosion Prevention Performance]

The cleaning liquid of each of Examples and Comparative Examples was taken in an amount of 0.02 mL and diluted 100 times by volume with ultrapure water to prepare a sample of a diluted cleaning liquid.

A wafer (diameter: 12 inches) having on its surface a metal film made of copper, tungsten or cobalt was cut to prepare a wafer coupon of 2 cm square. The thickness of each metal film was set to 200 nm. The wafer coupon was immersed in the sample of the diluted cleaning liquid (temperature: 23° C.) manufactured by the foregoing method and subjected to a 3-minute immersion treatment at a stirring rotational speed of 250 rpm. For each metal film, the copper, tungsten or cobalt content of the diluted cleaning liquid was measured before and after the immersion treatment. The corrosion rate (unit: Å/min) per unit time was calculated from the obtained measurement results. The corrosion prevention performance of each cleaning liquid was evaluated according to the following evaluation criteria. The results thereof are shown in Tables 1 and 2.

Note that a lower corrosion rate indicates better corrosion prevention performance of a cleaning liquid.

"A": A corrosion rate of lower than 0.5 Å/min

"B": A corrosion rate of not lower than 0.5 Å/min and lower than 1.0 Å/min

"C": A corrosion rate of not lower than 1.0 Å/min and lower than 3.0 Å/min

"D": A corrosion rate of not lower than 3.0 Å/min

TABLE 1

| | Cleaning liquid composition | | | | | | | | |
|---|---|---|---|---|---|---|---|---|---|
| | | | | | | Anticorrosive | | | |
| | Chelating agent | | Component A (Amine compound) | | | | | Nitrogen-containing | |
| Table 1 | Type | Amount (%) | Type | pKa1 | Amount (%) | Compound B | Amount (%) | heteroaromatic compound | Amount (%) |
| EX 1 | HEDPO | 0.12 | AMP | 9.7 | 6.0 | Trimellitic acid | 0.10 | — | — |
| EX 2 | HEDPO | 0.36 | AMP | 9.7 | 6.0 | Trimellitic acid | 0.10 | — | — |
| EX 3 | HEDPO<br>DTPA | 0.12<br>0.10 | AMP | 9.7 | 6.0 | Trimellitic acid | 0.10 | — | — |
| EX 4 | DTPA<br>Glycine | 0.10<br>0.02 | AMP | 9.7 | 6.0 | Trimellitic acid | 0.10 | — | — |
| EX 5 | 1,4-Diamino-butane | 0.12 | AMP | 9.7 | 6.0 | Trimellitic acid | 0.10 | — | — |
| EX 6 | HEDPO | 0.12 | AMP | 9.7 | 6.0 | 4-Hydroxyphthalic acid | 0.10 | — | — |
| EX 7 | HEDPO | 0.12 | AMP | 9.7 | 6.0 | 4-Aminophthalic acid | 0.10 | — | — |
| EX 8 | HEDPO | 0.12 | AMP | 9.7 | 6.0 | 4-Sulfophthalic acid | 0.10 | — | — |
| EX 9 | HEDPO | 0.12 | AMP | 9.7 | 6.0 | 5-Sulfosalicylic acid | 0.10 | — | — |
| EX 10 | HEDPO | 0.12 | AMP | 9.7 | 6.0 | 2,5-Dihydroxybenzoic acid | 0.10 | — | — |

TABLE 1-continued

| | | | | | | | | | |
|---|---|---|---|---|---|---|---|---|---|
| EX 11 | HEDPO | 0.12 | AMP | 9.7 | 6.0 | 5-Aminosalicylic acid | 0.10 | — | — |
| EX 12 | HEDPO | 0.12 | AMP | 9.7 | 6.0 | 4-Hydroxyisophthalic acid | 0.10 | — | — |
| EX 13 | HEDPO | 0.12 | AMP | 9.7 | 6.0 | 5-Hydroxyanthranilic acid | 0.10 | — | — |
| EX 14 | HEDPO | 0.12 | AMP | 9.7 | 6.0 | 2,5-Diaminobezoic acid | 0.10 | — | — |
| EX 15 | HEDPO | 0.12 | AMP | 9.7 | 6.0 | 5-Sulfoanthranilic acid | 0.10 | — | — |
| EX 16 | HEDPO | 0.12 | AMP | 9.7 | 6.0 | 1,3-Phenylenediamine-4-sulfonic acid | 0.10 | — | — |
| EX 17 | HEDPO | 0.12 | AMP | 9.7 | 6.0 | Amidol | 0.10 | — | — |
| EX 18 | HEDPO | 0.12 | AMP | 9.7 | 6.0 | 3-Amino-4-hydroxy-benzoic acid | 0.10 | — | — |
| EX 19 | HEDPO | 0.12 | AMP | 9.7 | 6.0 | 3-Amino-4-hydroxy-benzenesulfonic acid | 0.10 | — | — |
| EX 20 | HEDPO | 0.12 | AMP | 9.7 | 6.0 | Trimellitic acid | 0.50 | — | — |
| EX 21 | HEDPO | 0.12 | AMP | 9.7 | 6.0 | Trimellitic acid | 1.00 | — | — |
| EX 22 | HEDPO | 0.12 | AMP | 9.7 | 6.0 | Trimellitic acid | 0.02 | — | — |
| EX 23 | HEDPO | 0.12 | AMP | 9.7 | 6.0 | Trimellitic acid | 0.02 | — | — |
| EX 24 | HEDPO | 0.12 | AMP | 9.7 | 6.0 | Trimellitic acid | 0.02 | — | — |
| EX 25 | HEDPO<br>DTPA | 0.12<br>0.10 | MEA | 9.5 | 6.0 | Trimellitic acid | 0.10 | — | — |

| | Cleaning liquid composition | | | | | | | | |
|---|---|---|---|---|---|---|---|---|---|
| | Anticorrosive | | | | | | | | |
| | Reducing agent or | | | | Surfactant | | | Cleaning | Metal |
| Table 1 | quaternary salt | Amount (%) | Ratio 1.2 | Ratio 2 | Type | Amount (%) | pH adjuster | liquid pH | content (ppb) |
| EX 1 | — | — | 1.2 | 60.0 | Phosten HLP | — | *1 | 10.5 | <10 |
| EX 2 | — | — | 3.6 | 60.0 | Phosten HLP | 0.5 | *1 | 10.5 | <10 |
| EX 3 | — | — | 2.2 | 60.0 | Phosten HLP | 0.5 | *1 | 10.5 | <10 |
| EX 4 | — | — | 1.2 | 60.0 | Phosten HLP | 0.5 | *1 | 10.5 | <10 |
| EX 5 | — | — | 1.2 | 60.0 | Phosten HLP | 0.5 | *1 | 10.5 | <10 |
| EX 6 | — | — | 1.2 | 60.0 | Phosten HLP | 0.5 | *1 | 10.5 | <10 |
| EX 7 | — | — | 1.2 | 60.0 | Phosten HLP | 0.5 | *1 | 10.5 | <10 |
| EX 8 | — | — | 1.2 | 60.0 | Phosten HLP | 0.5 | *1 | 10.5 | <10 |
| EX 9 | — | — | 1.2 | 60.0 | Phosten HLP | 0.5 | *1 | 10.5 | <10 |
| EX 10 | — | — | 1.2 | 60.0 | Phosten HLP | 0.5 | *1 | 10.5 | <10 |
| EX 11 | — | — | 1.2 | 60.0 | Phosten HLP | 0.5 | *1 | 10.5 | <10 |
| EX 12 | — | — | 1.2 | 60.0 | Phosten HLP | 0.5 | *1 | 10.5 | <10 |
| EX 13 | — | — | 1.2 | 60.0 | Phosten HLP | 0.5 | *1 | 10.5 | <10 |
| EX 14 | — | — | 1.2 | 60.0 | Phosten HLP | 0.5 | *1 | 10.5 | <10 |
| EX 15 | — | — | 1.2 | 60.0 | Phosten HLP | 0.5 | *1 | 10.5 | <10 |
| EX 16 | — | — | 1.2 | 60.0 | Phosten HLP | 0.5 | *1 | 10.5 | <10 |
| EX 17 | — | — | 1.2 | 60.0 | Phosten HLP | 0.5 | *1 | 10.5 | <10 |
| EX 18 | — | — | 1.2 | 60.0 | Phosten HLP | 0.5 | *1 | 10.5 | <10 |
| EX 19 | — | — | 1.2 | 60.0 | Phosten HLP | 0.5 | *1 | 10.5 | <10 |
| EX 20 | — | — | 0.2 | 12.0 | Phosten HLP | 0.5 | *1 | 10.5 | <10 |
| EX 21 | — | — | 0.1 | 6.0 | Phosten HLP | 0.5 | *1 | 11.5 | <10 |
| EX 22 | — | — | 6.0 | 300.0 | Phosten HLP | 0.5 | *1 | 9.5 | <10 |

TABLE 1-continued

| | | | | | | | | | |
|---|---|---|---|---|---|---|---|---|---|
| EX 23 | TEAH | 0.1 | 6.0 | 300.0 | Phosten HLP | 0.5 | *1 | 10.5 | <10 |
| EX 24 | ETMAH | 0.1 | 6.0 | 300.0 | Phosten HLP | 0.5 | *1 | 10.5 | <10 |
| EX 25 | — | — | 2.2 | 60.0 | Phosten HLP | 0.5 | *1 | 10.5 | <10 |

EX: Example

TABLE 2

| | Parameter D.F measurement test | | | | | | | | | | |
|---|---|---|---|---|---|---|---|---|---|---|---|
| | Cu | | | | | W | | | | | Co |
| | Test 1 | | Test 2 | | | Test 1 | | Test 2 | | | Test 1 |
| Table 1 (Continuation) | Second contact angle (°) | Contact angle ratio | Particle size (nm) | Specific degree of agglom-eration | D.F (Cu) | Second contact angle (°) | Contact angle ratio | Particle size (nm) | Specific degree of agglom-eration | D.F (W) | Second contact angle (°) |
| EX 1 | 35 | 1.40 | 102 | 1.36 | 1.90 | 42 | 2.10 | 122 | 1.63 | 3.43 | 41 |
| EX 2 | 23 | 0.92 | 90 | 1.20 | 1.10 | 28 | 1.38 | 108 | 1.44 | 1.99 | 28 |
| EX 3 | 32 | 1.28 | 75 | 1.00 | 1.28 | 38 | 1.92 | 90 | 1.20 | 2.30 | 25 |
| EX 4 | 45 | 1.80 | 92 | 1.23 | 2.21 | 54 | 2.70 | 110 | 1.47 | 3.97 | 46 |
| EX 5 | 51 | 2.04 | 123 | 1.64 | 3.35 | 61 | 3.06 | 148 | 1.97 | 6.02 | 44 |
| EX 6 | 32 | 1.28 | 123 | 1.64 | 2.10 | 38 | 1.92 | 148 | 1.97 | 3.78 | 65 |
| EX 7 | 33 | 1.32 | 132 | 1.76 | 2.32 | 40 | 1.98 | 158 | 2.11 | 4.18 | 52 |
| EX 8 | 35 | 1.40 | 157 | 2.09 | 2.93 | 42 | 2.10 | 188 | 2.51 | 5.28 | 71 |
| EX 9 | 41 | 1.64 | 145 | 1.93 | 3.17 | 49 | 2.46 | 174 | 2.32 | 5.71 | 31 |
| EX 10 | 35 | 1.40 | 168 | 2.24 | 3.14 | 42 | 2.10 | 202 | 2.69 | 5.64 | 71 |
| EX 11 | 33 | 1.32 | 214 | 2.85 | 3.77 | 40 | 1.98 | 257 | 3.42 | 6.78 | 48 |
| EX 12 | 38 | 1.52 | 231 | 3.08 | 4.68 | 46 | 2.28 | 277 | 3.70 | 8.43 | 35 |
| EX 13 | 41 | 1.64 | 211 | 2.81 | 4.61 | 49 | 2.46 | 253 | 3.38 | 8.30 | 30 |
| EX 14 | 32 | 1.28 | 241 | 3.21 | 4.11 | 38 | 1.92 | 289 | 3.86 | 7.40 | 46 |
| EX 15 | 35 | 1.40 | 251 | 3.35 | 4.69 | 42 | 2.10 | 301 | 4.02 | 8.43 | 56 |
| EX 16 | 36 | 1.44 | 261 | 3.48 | 5.01 | 43 | 2.16 | 313 | 4.18 | 9.02 | 54 |
| EX 17 | 41 | 1.64 | 214 | 2.85 | 4.68 | 49 | 2.46 | 257 | 3.42 | 8.42 | 45 |
| EX 18 | 34 | 1.36 | 189 | 2.52 | 3.43 | 41 | 2.04 | 227 | 3.02 | 6.17 | 69 |
| EX 19 | 33 | 1.32 | 145 | 1.93 | 2.55 | 40 | 1.98 | 174 | 2.32 | 4.59 | 67 |
| EX 20 | 40 | 1.60 | 85 | 1.13 | 1.81 | 45 | 2.25 | 123 | 1.64 | 3.69 | 35 |
| EX 21 | 45 | 1.80 | 78 | 1.04 | 1.87 | 68 | 3.40 | 94 | 1.25 | 4.24 | 46 |
| EX 22 | 40 | 1.60 | 123 | 1.64 | 2.62 | 48 | 2.40 | 148 | 1.97 | 4.72 | 45 |
| EX 23 | 40 | 1.60 | 123 | 1.64 | 2.62 | 45 | 2.25 | 148 | 1.97 | 4.43 | 29 |
| EX 24 | 40 | 1.60 | 123 | 1.64 | 2.62 | 39 | 1.95 | 148 | 1.97 | 3.84 | 25 |
| EX 25 | 35 | 1.40 | 102 | 1.36 | 1.90 | 42 | 2.10 | 122 | 1.63 | 3.43 | 71 |

| | Parameter D.F measurement test Co | | | | | | | | | |
|---|---|---|---|---|---|---|---|---|---|---|
| | Test 2 | | | | | | | | | |
| Table 1 | Test 1 Contact angle | Particle size | Specific degree of agglom- | D.F | Abrasive particle removing performance | | | Corrosion prevention performance | | |
| (Continuation) | ratio | (nm) | eration | (Co) | Cu | W | Co | Cu | W | Co |
| EX 1 | 1.37 | 24 | 2.45 | 3.35 | A | B | B | B | B | B |
| EX 2 | 0.93 | 22 | 2.16 | 2.02 | A | A | A | B | B | B |
| EX 3 | 0.83 | 18 | 1.80 | 1.50 | A | A | A | B | B | B |
| EX 4 | 1.53 | 22 | 2.21 | 3.39 | A | B | B | B | B | B |
| EX 5 | 1.47 | 68 | 6.80 | 9.97 | A | C | C | B | B | B |
| EX 6 | 2.18 | 30 | 2.95 | 6.42 | A | B | C | B | B | B |
| EX 7 | 1.73 | 32 | 3.17 | 5.49 | A | B | C | B | B | B |
| EX 8 | 2.38 | 38 | 3.77 | 8.97 | A | B | C | B | B | B |
| EX 9 | 1.03 | 67 | 6.70 | 6.92 | A | B | C | B | B | B |
| EX 10 | 2.38 | 40 | 4.03 | 9.60 | A | B | C | B | B | B |
| EX 11 | 1.60 | 32 | 3.20 | 5.12 | A | C | C | B | B | B |
| EX 12 | 1.17 | 55 | 5.54 | 6.47 | B | C | C | B | B | B |
| EX 13 | 1.00 | 51 | 5.06 | 5.06 | B | C | C | B | B | B |
| EX 14 | 1.53 | 58 | 5.78 | 8.87 | B | C | C | B | B | B |
| EX 15 | 1.87 | 60 | 6.02 | 11.24 | B | C | C | B | B | B |
| EX 16 | 1.80 | 63 | 6.26 | 11.28 | B | C | C | B | B | B |
| EX 17 | 1.50 | 51 | 5.14 | 7.70 | B | C | C | B | B | B |
| EX 18 | 2.31 | 45 | 4.54 | 10.49 | A | C | C | B | B | B |
| EX 19 | 2.24 | 35 | 3.48 | 7.81 | A | B | C | B | B | B |

TABLE 2-continued

| | | | | | | | | | | |
|---|---|---|---|---|---|---|---|---|---|---|
| EX 20 | 1.17 | 35 | 3.50 | 4.08 | A | B | B | B | B | B |
| EX 21 | 1.53 | 40 | 4.00 | 6.13 | A | B | C | B | B | B |
| EX 22 | 1.50 | 30 | 2.95 | 4.43 | A | B | B | B | B | B |
| EX 23 | 0.97 | 30 | 2.95 | 2.85 | A | B | A | B | B | B |
| EX 24 | 0.83 | 30 | 2.95 | 2.46 | A | B | A | B | B | B |
| EX 25 | 2.38 | 24 | 2.45 | 5.83 | A | B | C | B | B | B |

EX: Example

TABLE 3

| | Cleaning liquid composition | | | | | | | | |
|---|---|---|---|---|---|---|---|---|---|
| | | | | | | Anticorrosive | | | |
| | Chelating agent | | Component A (Amine compound) | | | | | Nitrogen-containing | |
| Table 2 | Type | Amount (%) | Type | pKa1 | Amount (%) | Compound B | Amount (%) | heteroaromatic compound | Amount (%) |
| EX 26 | HEDPO<br>Adipic acid | 0.12<br>0.10 | MEA | 9.5 | 6.0 | Trimellitic acid | 0.10 | — | — |
| EX 27 | HEDPO<br>DTPA | 0.12<br>0.10 | AMP | 9.7 | 6.0 | Trimellitic acid | 0.10 | 2-Amino-pyrimidine | 0.15 |
| EX 28 | HEDPO<br>DTPA<br>CHG | 0.12<br>0.10<br>0.05 | AMP | 9.7 | 6.0 | Trimellitic acid | 0.10 | 3-Amino-5-methylpyrazole | 0.20 |
| EX 29 | HEDPO<br>DTPA<br>Gluconic acid | 0.12<br>0.10<br>0.20 | AMP | 9.7 | 6.0 | Trimellitic acid | 0.10 | 2-Amino-pyrimidine | 0.15 |
| EX 30 | HEDPO<br>DTPA<br>Citric acid | 0.12<br>0.10<br>0.10 | AMP | 9.7 | 6.0 | Trimellitic acid | 0.10 | 2-Amino-pyrimidine | 0.15 |
| EX 31 | HEDPO<br>DTPA | 0.12<br>0.10 | AMP | 9.7 | 6.0 | Trimellitic acid | 0.10 | 2-Amino-pyrimidine | 0.15 |
| EX 32 | HEDPO<br>DTPA | 0.12<br>0.10 | AMP | 9.7 | 6.0 | Trimellitic acid | 0.10 | Adenine | 0.15 |
| EX 33 | HEDPO<br>DTPA | 0.12<br>0.10 | AMP | 9.7 | 6.0 | Trimellitic acid | 0.10 | Pyrazole | 0.15 |
| EX 34 | HEDPO<br>DTPA | 0.12<br>0.10 | AMP | 9.7 | 6.0 | Trimellitic acid | 0.10 | 3-Amino-5-methylpyrazole | 0.15 |
| EX 35 | HEDPO<br>DTPA<br>CHG | 0.12<br>0.10<br>0.05 | AMP | 9.7 | 6.0 | Trimellitic acid | 0.10 | — | — |
| EX 36 | HEDPO<br>DTPA | 0.12<br>0.10 | AMP | 9.7 | 6.0 | Trimellitic acid | 0.10 | 2-Amino-benzimidazole | 0.20 |
| CE 1 | HEDPO | 0.12 | AMP | 9.7 | 6.0 | BTA | 0.10 | — | — |
| CE 2 | — | — | AMP | 9.7 | 6.0 | Trimellitic acid | 0.10 | — | — |
| CE 3 | HEDPO | 0.12 | AMP | 9.7 | 6.0 | Trimellitic acid | 0.10 | — | — |
| CE4 | HEDPO | 0.12 | TEA | <8.0 | 6.0 | Trimellitic acid | 0.10 | — | — |

| | Cleaning liquid composition | | | | | | | | |
|---|---|---|---|---|---|---|---|---|---|
| | Anticorrosive | | | | | | | | |
| | Reducing agent or | | | | Surfactant | | | Cleaning | Metal |
| Table 2 | quaternary salt | Amount (%) | Ratio 1.2 | Ratio 2 | Type | Amount (%) | pH adjuster | liquid pH | content (ppb) |
| EX 26 | — | — | 2.2 | 60.0 | Phosten HLP | 0.5 | *1 | 10.5 | <10 |
| EX 27 | — | — | 0.9 | 24.0 | Phosten HLP | 0.5 | *1 | 11.5 | <10 |
| EX 28 | — | — | 0.9 | 20.0 | Phosten HLP | 0.5 | *1 | 10.5 | <10 |
| EX 29 | — | — | 1.7 | 24.0 | Phosten HLP | 0.5 | *1 | 10.5 | <10 |
| EX 30 | — | — | 1.3 | 24.0 | Phosten HLP | 0.5 | *1 | 10.5 | <10 |
| EX 31 | Ascorbic acid | 1.0 | 0.2 | 4.8 | Phosten HLP | 0.5 | *1 | 10.5 | <10 |
| EX 32 | Ascorbic acid<br>DEHA | 1.0<br>0.5 | 0.1 | 3.4 | Phosten HLP | 0.5 | *1 | 9.5 | <10 |
| EX 33 | — | — | 0.9 | 24.0 | Phosten HLP | 0.5 | *1 | 10.5 | <10 |

TABLE 3-continued

| | | | | | | | | | |
|---|---|---|---|---|---|---|---|---|---|
| EX 34 | — | — | 0.9 | 24.0 | Phosten HLP | 0.5 | *1 | 10.5 | <10 |
| EX 35 | — | — | — | — | Phosten HLP | 0.5 | *1 | 10.5 | <10 |
| EX 36 | — | — | 0.7 | 20.0 | Phosten HLP | 0.5 | *1 | 10.5 | <10 |
| CE 1 | — | — | 1.2 | 60.0 | Phosten HLP | 0.5 | *1 | 10.5 | <10 |
| CE 2 | — | — | — | 60.0 | Phosten HLP | 0.5 | *1 | 10.5 | <10 |
| CE 3 | — | — | 1.2 | 60.0 | TMDH | 0.5 | *1 | 10.5 | <10 |
| CE4 | — | — | — | 60.0 | Phosten HLP | 0.5 | *1 | 10.5 | <10 |

EX: Example
CE: Comparative Example

TABLE 4

| Table 2 (Continuation) | Parameter D.F measurement test | | | | | | | | | | |
|---|---|---|---|---|---|---|---|---|---|---|---|
| | Cu | | | | | W | | | | | Co |
| | Test 1 | | Test 2 | | | Test 1 | | Test 2 | | | Test 1 |
| | Second contact angle (°) | Contact angle ratio | Particle size (nm) | Specific degree of agglom-eration | D.F (Cu) | Second contact angle (°) | Contact angle ratio | Particle size (nm) | Specific degree of agglom-eration | D.F (W) | Second contact angle (°) |
| EP 26 | 30 | 1.20 | 102 | 1.36 | 1.63 | 36 | 1.80 | 109 | 1.45 | 2.62 | 36 |
| EP 27 | 32 | 1.28 | 98 | 1.31 | 1.67 | 38 | 1.92 | 118 | 1.57 | 3.01 | 27 |
| EP 28 | 31 | 1.24 | 92 | 1.23 | 1.52 | 37 | 1.86 | 110 | 1.47 | 2.74 | 26 |
| EP 29 | 33 | 1.32 | 85 | 1.13 | 1.50 | 40 | 1.98 | 102 | 1.36 | 2.69 | 28 |
| EP 30 | 34 | 1.36 | 91 | 1.21 | 1.65 | 41 | 2.04 | 109 | 1.46 | 2.97 | 29 |
| EP 31 | 32 | 1.28 | 90 | 1.20 | 1.54 | 38 | 1.92 | 108 | 1.44 | 2.76 | 27 |
| EP 32 | 31 | 1.24 | 93 | 1.24 | 1.54 | 37 | 1.86 | 112 | 1.49 | 2.77 | 26 |
| EP 33 | 30 | 1.20 | 94 | 1.25 | 1.50 | 36 | 1.80 | 113 | 1.50 | 2.71 | 25 |
| EP 34 | 29 | 1.16 | 98 | 1.31 | 1.52 | 35 | 1.74 | 118 | 1.57 | 2.73 | 24 |
| EP 35 | 23 | 0.92 | 97 | 1.29 | 1.19 | 28 | 1.38 | 116 | 1.55 | 2.14 | 19 |
| EP 36 | 34 | 1.36 | 92 | 1.23 | 1.67 | 41 | 2.04 | 110 | 1.47 | 3.00 | 29 |
| CE 1 | 85 | 3.40 | 698 | 9.3 | 31.6 | 35 | 1.75 | 5982 | 79.8 | 139.6 | 105 |
| CE 2 | 34 | 1.36 | 2871 | 38.3 | 52.1 | 45 | 2.25 | 7891 | 105.2 | 236.7 | 23 |
| CE 3 | 58 | 2.32 | 781 | 10.4 | 24.2 | 96 | 4.80 | 2567 | 34.2 | 164.3 | 58 |
| CE 4 | 34 | 1.36 | 2871 | 38.3 | 52.1 | 45 | 2.25 | 7891 | 105.2 | 236.7 | 23 |

| Table 2 (Continuation) | Parameter D.F measurement test Co | | | | Abrasive particle removing performance | | | Corrosion prevention performance | | |
|---|---|---|---|---|---|---|---|---|---|---|
| | Test 2 | | | | | | | | | |
| | Test 1 Contact angle ratio | Particle size (nm) | Specific degree of agglom-eration | D.F (Co) | Cu | W | Co | Cu | W | Co |
| EP 26 | 1.20 | 25 | 2.50 | 3.00 | A | A | A | A | A | A |
| EP 27 | 0.90 | 24 | 2.35 | 2.11 | A | A | A | A | B | A |
| EP 28 | 0.87 | 22 | 2.21 | 1.92 | A | A | A | A | A | A |
| EP 29 | 0.92 | 20 | 2.04 | 1.88 | A | A | A | A | B | A |
| EP 30 | 0.95 | 22 | 2.18 | 2.08 | A | A | A | A | B | A |
| EP 31 | 0.90 | 22 | 2.16 | 1.94 | A | A | A | A | B | A |
| EP 32 | 0.87 | 22 | 2.23 | 1.94 | A | A | A | A | B | A |
| EP 33 | 0.84 | 23 | 2.26 | 1.90 | A | A | A | A | B | A |
| EP 34 | 0.81 | 24 | 2.35 | 1.91 | A | A | A | A | B | A |
| EP 35 | 0.64 | 23 | 2.33 | 1.50 | A | A | A | B | A | B |
| EP 36 | 0.95 | 22 | 2.21 | 2.10 | A | A | A | A | B | A |
| CE 1 | 3.50 | 592 | 59.2 | 207.2 | D | D | D | B | B | B |
| CE 2 | 0.77 | 324 | 32.4 | 24.8 | D | D | D | B | B | B |
| CE 3 | 1.93 | 478 | 47.8 | 92.4 | D | D | D | B | B | B |
| CE 4 | 0.77 | 324 | 32.4 | 24.8 | D | D | D | B | B | B |

EX: Example
CE: Comparative Example

As evident from Tables 1 to 2, it was confirmed that the cleaning method of the invention is excellent in abrasive particle removing performance with respect to a metal film.

It was confirmed that when the cleaning liquid contains the quaternary ammonium compound as the anticorrosive, the abrasive particle removing performance with respect to a Co-containing metal film is more excellent (comparison between Examples 22 to 24).

It was confirmed that when the cleaning liquid contains the nitrogen-containing heteroaromatic compound as the anticorrosive, the corrosion prevention performance with respect to a Cu- or Co-containing metal film is more excellent (comparison between Example 25 and Examples 27 to 34 and 36).

It was confirmed that when the cleaning liquid contains adipic acid or CHG as the chelating agent, the corrosion prevention performance with respect to a W-containing metal film is more excellent (comparison between Example 25 and Examples 26, 28 and 35).

What is claimed is:

1. A cleaning liquid for semiconductor substrates having undergone a chemical mechanical polishing process using a polishing liquid containing abrasive particles, wherein the cleaning liquid comprises:

A) a component that is at least one selected from the group consisting of an amino alcohol, an alicyclic amine compound, and a monoamine compound other than the amino alcohol and the alicyclic amine compound, a first acidity constant of a conjugated acid of the component A being not less than 8.0;

B) an anticorrosive agent represented by the following Formula (1)

(1)

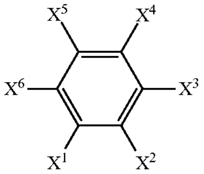

where $X^1$ and $X^2$ each independently represent a hydrophilic group, $X^3$ to $X^6$ each independently represent a hydrogen atom or a substituent, and at least one of $X^3$ to $X^6$ represents a hydrophilic group, and adjacent two of $X^3$ to $X^6$ may be bonded together to form a ring that may have a substituent, and the anticorrosive agent is at least one selected from the group consisting of 4-hydroxyphthalic acid, 4-aminophthalic acid, 4-sulfophthalic acid, 2,5-dihydroxybenzoic acid, 5-aminosalicylic acid, 4-hydroxyisophthalic acid, anthranilic acid derivatives in which $X^1$ represents an amino group and $X^2$ represents a carboxyl group, o-aminophenol derivatives in which $X^1$ represents a hydroxy group and $X^2$ represents an amino group, and 1,3-phenylenediamine-4-sulfonic acid;

C) a chelating agent that is a compound having at least one coordination group selected from the group consisting of a carboxyl group and a phosphonic acid group; and D) 60 to 99 mass % water based on a total mass of the cleaning liquid, wherein the cleaning liquid has a pH of from 8.5 to 12.0 at 25° C., and the cleaning liquid satisfies Condition 1 that a product of a contact angle ratio obtained by a test method 1 and a specific degree of agglomeration obtained by a test method 2 is not more than 15, wherein the test method 1 is that:

an object substrate having on its surface a metal film made of copper is subjected to a pretreatment for the metal film using an acid, whereafter a static contact angle of the metal film having undergone the pretreatment with respect to water is measured by a sessile drop method to obtain a first contact angle (°); separately, the object substrate is subjected to the pretreatment for the metal film using the acid, whereafter the metal film having undergone the pretreatment is allowed to contact the cleaning liquid for 1 minute; subsequently, a drying treatment is carried out for drying a surface of the metal film by spraying nitrogen gas thereto; a static contact angle of the metal film with respect to water is measured by the sessile drop method within 3 minutes after the surface of the metal film is dried through the drying treatment, thus obtaining a second contact angle (°); and a ratio of the second contact angle to the first contact angle is calculated to obtain the contact angle ratio, and the test method 2 is that: copper(II) chloride is added to the polishing liquid such that a concentration of $Cu^{+2}$ ions is 0.03 mM in the polishing liquid; the copper(II) chloride is dissolved in the polishing liquid and allowed to stand for 30 seconds, whereafter the polishing liquid is added to the cleaning liquid such that an amount of the added polishing liquid is 1 mass % based on a total mass of the cleaning liquid; the cleaning liquid is stirred to disperse the abrasive particles and then allowed to stand for 30 seconds, whereafter the abrasive particles are taken out from the cleaning liquid; an average secondary particle size of the abrasive particles taken out is measured; and a ratio of the average secondary particle size of the abrasive particles taken out from the cleaning liquid to an average secondary particle size of the abrasive particles contained in the polishing liquid before the copper(II) chloride is added is calculated to obtain the specific degree of agglomeration.

2. A cleaning liquid for semiconductor substrates having undergone a chemical mechanical polishing process using a polishing liquid containing abrasive particles, wherein the cleaning liquid comprises:

A) a component that is at least one selected from the group consisting of an amino alcohol, an alicyclic amine compound, and a monoamine compound other than the amino alcohol and the alicyclic amine compound, a first acidity constant of a conjugated acid of the component A being not less than 8.0;

B) an anticorrosive agent represented by the following Formula (1)

(1)

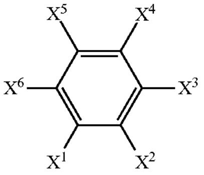

where $X^1$ and $X^2$ each independently represent a hydrophilic group, $X^3$ to $X^6$ each independently represent a hydrogen atom or a substituent, and at least one of $X^3$ to $X^6$ represents a hydrophilic group, and adjacent two of $X^3$ to $X^6$ may be bonded together to form a ring that may have a substituent, and the anticorrosive agent is at least one selected from the group consisting of 4-hydroxyphthalic acid, 4-aminophthalic acid, 4-sulfophthalic acid, 2,5-dihydroxybenzoic acid, 5-aminosalicylic acid, 4-hydroxyisophthalic acid, anthranilic acid derivatives in which $X^1$ represents an amino group and $X^2$ represents a carboxyl group, o-aminophenol derivatives in which $X^1$ represents a hydroxy group and $X^2$ represents an amino group, and 1,3-phenylenediamine-4-sulfonic acid;

C) a chelating agent that is a compound having at least one coordination group selected from the group consisting of a carboxyl group and a phosphonic acid group; and D) 60 to 99 mass % water based on a total mass of the cleaning liquid, wherein the cleaning liquid has a pH of from 8.5 to 12.0 at 25° C., and the cleaning liquid satisfies Condition 1 that a product of a contact angle ratio obtained by a test method 1 and a specific degree of agglomeration obtained by a test method 2 is not more than 15, wherein the test method 1 is that:

an object substrate having on its surface a metal film made of cobalt is subjected to a pretreatment for the metal film using an acid, whereafter a static contact angle of the metal film having undergone the pretreatment with respect to water is measured by a sessile drop method to obtain a first contact angle (°); separately, the object substrate is subjected to the pretreatment for the metal film using the acid, whereafter the metal film having undergone the pretreatment is allowed to contact the cleaning liquid for 1 minute; subsequently, a drying treatment is carried out for drying a surface of the metal film by spraying nitrogen gas thereto; a static contact angle of the metal film with respect to water is measured by the sessile drop method within 3 minutes after the surface of the metal film is dried through the drying treatment, thus obtaining a second contact angle (°); and a ratio of the second contact angle to the first contact angle is calculated to obtain the contact angle ratio, and the test method 2 is that: cobalt(II) chloride is added to the polishing liquid such that a concentration of $Co^{+2}$ ions is 0.03 mM in the polishing liquid; the cobalt(II) chloride is dissolved in the polishing liquid and allowed to stand for 30 seconds, whereafter the polishing liquid is added to the cleaning liquid such that an amount of the added polishing liquid is 1 mass % based on a total mass of the cleaning liquid; the cleaning liquid is stirred to disperse the abrasive particles and then allowed to stand for 30 seconds, whereafter the abrasive particles are taken out from the cleaning liquid; an average secondary particle size of the abrasive particles taken out is measured; and a ratio of the average secondary particle size of the abrasive particles taken out from the cleaning liquid to an average secondary particle size of the abrasive particles contained in the polishing liquid before the cobalt(II) chloride is added is calculated to obtain the specific degree of agglomeration.

3. The cleaning liquid according to claim 1, wherein the second contact angle is not more than 30°.

4. The cleaning liquid according to claim 1, wherein the average secondary particle size of the abrasive particles measured in the test cleaning liquid 2 is not more than 100 nm.

5. The cleaning liquid according to claim 1, wherein the specific degree of agglomeration obtained in the test cleaning liquid 2 is 1 to 10.

6. The cleaning liquid according to claim 1, wherein the component A comprises an amino alcohol.

7. The cleaning liquid according to claim 6, wherein the amino alcohol has a primary amino group.

8. The cleaning liquid according to claim 6, wherein a mass ratio of a content of the amino alcohol to a content of the anticorrosive is 1 to 100.

9. The cleaning liquid according to claim 1, wherein the anticorrosive further comprises a nitrogen-containing heteroaromatic compound.

10. The cleaning liquid according to claim 9, wherein the nitrogen-containing heteroaromatic compound comprises a compound having a pyrazole ring or a compound having a pyrimidine ring.

11. The cleaning liquid according to claim 1, wherein the chelating agent comprises at least one selected from the group consisting of a phosphonic acid-based chelating agent and an aminopolycarboxylic acid-based chelating agent.

12. The cleaning liquid according to claim 1, wherein a mass ratio of a content of the chelating agent to a content of the anticorrosive is 0.01 to 20.

13. The cleaning liquid according to claim 1, wherein the anticorrosive further comprises two or more reducing agents.

14. The cleaning liquid according to claim 1, wherein the anticorrosive further comprises a quaternary ammonium compound having an asymmetric structure.

15. The cleaning liquid according to claim 2, wherein the second contact angle is not more than 30°.

16. The cleaning liquid according to claim 2, wherein the average secondary particle size of the abrasive particles measured in the test cleaning liquid 2 is not more than 100 nm.

17. The cleaning liquid according to claim 2, wherein the specific degree of agglomeration obtained in the test cleaning liquid 2 is 1 to 10.

18. The cleaning liquid according to claim 2, wherein the component A comprises an amino alcohol.

19. The cleaning liquid according to claim 18, wherein the amino alcohol has a primary amino group.

20. The cleaning liquid according to claim 18, wherein a mass ratio of a content of the amino alcohol to a content of the anticorrosive is 1 to 100.

21. The cleaning liquid according to claim 2, wherein the anticorrosive further comprises a nitrogen-containing heteroaromatic compound.

22. The cleaning liquid according to claim 21, wherein the nitrogen-containing heteroaromatic compound comprises a compound having a pyrazole ring or a compound having a pyrimidine ring.

23. The cleaning liquid according to claim 2, wherein the chelating agent comprises at least one selected from the group consisting of a phosphonic acid-based chelating agent and an aminopolycarboxylic acid-based chelating agent.

24. The cleaning liquid according to claim 2, wherein a mass ratio of a content of the chelating agent to a content of the anticorrosive is 0.01 to 20.

25. The cleaning liquid according to claim 2, wherein the anticorrosive further comprises two or more reducing agents.

26. The cleaning liquid according to claim 2, wherein the anticorrosive further comprises a quaternary ammonium compound having an asymmetric structure.

27. The cleaning liquid according to claim 1, wherein one of $X^4$ and $X^5$ represents a hydrophilic group, and $X^3$, $X^6$, and the remaining one of $X^4$ and $X^5$ represent a hydrogen atom.

28. The cleaning liquid according to claim 1, wherein adjacent two of $X^3$ to $X^6$ may be bonded together to form a benzene ring or a pyridine ring that may have a substituent selected from the group consisting of a carboxyl group, an amino group, and a hydroxy group.

29. The cleaning liquid according to claim 1, wherein a content of the anticorrosive agent is 0.001 to 10 mass % based on the total mass of the cleaning liquid.

30. The cleaning liquid according to claim 1, wherein a content of the anticorrosive agent is 0.01 to 50 mass % based on the total mass of components, excluding a solvent, in the cleaning liquid.

31. The cleaning liquid according to claim 2, wherein one of $X^4$ and $X^5$ represents a hydrophilic group, and $X^3$, $X^6$, and the remaining one of $X^4$ and $X^5$ represent a hydrogen atom.

32. The cleaning liquid according to claim 2, wherein adjacent two of $X^3$ to $X^6$ may be bonded together to form a benzene ring or a pyridine ring that may have a substituent selected from the group consisting of a carboxyl group, an amino group, and a hydroxy group.

33. The cleaning liquid according to claim 2, wherein a content of the compound B is 0.001 to 10 mass % based on the total mass of the cleaning liquid.

34. The cleaning liquid according to claim 2, wherein a content of the anticorrosive agent is 0.01 to 50 mass % based on the total mass of components, excluding a solvent, in the cleaning liquid.

35. The cleaning liquid according to claim 1, wherein the anticorrosive agent is at least one selected from the group consisting of 4-sulfophthalic acid and 2,5-dihydroxybenzoic acid.

36. The cleaning liquid according to claim 1, wherein the cleaning liquid has a pH of not less than 9.0 and not more than 11.5 at 25° C.

37. The cleaning liquid according to claim 2, wherein the anticorrosive agent is at least one selected from the group consisting of 4-sulfophthalic acid and 2,5-dihydroxybenzoic acid.

38. The cleaning liquid according to claim 2, wherein the cleaning liquid has a pH of not less than 9.0 and not more than 11.5 at 25° C.

39. A method of cleaning semiconductor substrates, the method comprising contacting a semiconductor with the cleaning liquid according to claim 1, wherein the semiconductor substrate has undergone a chemical mechanical polishing process using a polishing liquid containing abrasive particles, and the semiconductor substrate contains metal.

* * * * *